(12) United States Patent
Tabuchi et al.

(10) Patent No.: US 7,012,301 B2
(45) Date of Patent: Mar. 14, 2006

(54) TRENCH LATERAL POWER MOSFET AND A METHOD OF MANUFACTURING THE SAME

(75) Inventors: Katsuya Tabuchi, Nagano (JP); Naoto Fujishima, Nagano (JP); Mutsumi Kitamura, Nagano (JP); Akio Sugi, Nagano (JP)

(73) Assignee: Fuji Electric Co., Ltd., (JP)

( * ) Notice: Subject to any disclaimer, the term of this patent is extended or adjusted under 35 U.S.C. 154(b) by 0 days.

(21) Appl. No.: 10/322,367

(22) Filed: Dec. 18, 2002

(65) Prior Publication Data

US 2003/0132460 A1 Jul. 17, 2003

(30) Foreign Application Priority Data

Dec. 18, 2001 (JP) .............................. 2001-384904

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ...................... 257/343; 257/341; 257/342; 257/333

(58) Field of Classification Search ................ 257/213, 257/401, 341–343, 333
See application file for complete search history.

(56) References Cited

U.S. PATENT DOCUMENTS

| 5,434,435 | A | * | 7/1995 | Baliga ......................... 257/141 |
| 6,271,080 | B1 | * | 8/2001 | Mandelman et al. ........ 438/243 |
| 6,316,807 | B1 | * | 11/2001 | Fujishima et al. ........... 257/333 |
| 2002/0179928 | A1 | * | 12/2002 | Fujishima .................... 257/163 |

OTHER PUBLICATIONS

"A trench lateral power MOSFET using self-aligned trench bottom contact holes"; Naoto Fujishima et al.; IEDM '97 Digest; pp. 359-362.

* cited by examiner

Primary Examiner—Amir Zarabian
Assistant Examiner—Monica Lewis
(74) Attorney, Agent, or Firm—Rossi, Kimms & McDowell, LLP

(57) ABSTRACT

A semiconductor device is provided that can be manufactured by a simpler process than a conventional lateral trench power MOSFET for use with an 80V breakdown voltage, and which has a lower device pitch and lower on-state resistance per unit area than a conventional lateral power MOSFET for use with a lower breakdown voltage than 80V. A gate oxide film is formed thinly along the lateral surfaces of a trench at a uniform thickness. Then, a gate oxide film is formed along the bottom surface of the trench by selective oxidation so as to be thicker than the gate oxide film on the lateral surfaces of the trench and so as to become progressively thicker from the edge of the bottom surface of the trench toward drain polysilicon.

6 Claims, 33 Drawing Sheets

TRENCH LATERAL POWER MOSFET AND A METHOD OF MANUFACTURING THE SAME

BACKGROUND OF THE INVENTION

1. Field of the Invention

The present invention relates to a semiconductor device and a manufacturing method for a semiconductor device and, more particularly, to preferred technology to be applied to a low on-state resistance power MOSFET (insulated gate field-effect transistor) including, for example, a trench lateral power MOSFET provided with a gate electrode inside a trench which is dug into a semiconductor substrate surface, which is suitable for use with an integrated circuit that controls high currents at a high breakdown voltage such as a switching current IC, an IC for driving an automobile power system, or an IC for driving a flat panel display.

2. Description of the Related Art

The importance of power ICs with in-built power MOS-FETs has risen with the rapid popularization of portable devices and advances in high-speed communication technology. It has been hoped that conventional constructions of power ICs with a lateral power MOSFET integrated into a control circuit, in which the power MOSFET element is combined with a control drive circuit, will lead to miniaturization, lower energy consumption, higher reliability, and cost reduction. The development of high-performance lateral power MOSFETs based on a CMOS process is being conducted vigorously to this end.

MOSFETs with a trench construction are known as technology for increasing the degree of integration by reducing the device pitch. The present inventor has proposed a lateral power MOSFET in which a trench construction is applied (to be referred to hereafter as "trench lateral power MOSFET") in "A Trench Lateral Power MOSFET using Self-aligned Trench Bottom Contact Holes" (IEDM '97 Digest, pages 359 to 362, 1997). FIGS. 31 through 33 illustrate the construction of this trench lateral power MOSFET, FIG. 31 being a plan view thereof. FIG. 32 illustrates the construction of a region (referred to as the "active region" in this specification) in which the source electrode and the drain electrode are connected with a semiconductor, a gate electrode is provided and current flows, and is a sectional view along the A—A line in FIG. 31. FIG. 33 illustrates the construction of a region (referred to as the "gate region" in this specification) in which gate polysilicon is deposited on a substrate surface, and is a sectional view along the B—B line in FIG. 31.

The MOSFET 202 has a construction in which a gate oxide film 22 is formed along the inner peripheral surface of a trench 21 which is formed in a p⁻ substrate 20, gate polysilicon 23 is formed inside the gate oxide film 22, and an n⁺ diffusion region 29 which serves as a drain region and an n⁺ diffusion region 27 which serves as a source region are formed at the bottom of the trench 21 and on the outer periphery of the trench 21 respectively. The n⁺ diffusion region 29 (drain region) is surrounded by an n⁻ diffusion region 28 (n⁻ drain region) so as to enclose the lower half of the trench 21, and this n⁻ diffusion region 28 is further surrounded by a p⁻ diffusion region 31 which serves as a p body.

A p⁺ diffusion region 32 is provided on the outside of the n⁺ diffusion region 27 (source region), and a p base region 33 is formed therebeneath. A thick oxide film 34 is provided inside the lower half of the trench 21 so as to maintain the breakdown voltage. In FIGS. 31 through 33, the symbol 24 indicates a source electrode, symbol 25 indicates a drain electrode, symbol 26 indicates an interlayer oxide film, symbol 35 indicates a gate electrode, symbols 36 and 37 both indicate contact portions, symbol 38 indicates an n⁺ diffusion region, and symbols 39 and 40 both indicate interlayer oxide films. According to this trench lateral power MOSFET 202, on-state resistance is 80 mΩ·mm² per unit area with a breakdown voltage of 80V. The device pitch is 4 μm, approximately half the device pitch of a conventional 80V breakdown voltage lateral power MOSFET.

It is also desirable to apply a trench construction to a lateral power MOSFET with a lower breakdown voltage than 80V, for example 30V, in order to reduce the device pitch. Since the trench lateral power MOSFET 202 shown in FIGS. 31 through 33 is constructed to be applied to a breakdown voltage of 80V, however, the following problem occurs when applied without modification to a breakdown voltage lower than 80V. That is, when the breakdown voltage is lower than 80V, the thickness of the oxide film 34 for maintaining breakdown voltage may be thinner than that required to maintain a breakdown voltage of 80V. In other words, as long as the thickness of this oxide film 34 is set sufficiently thickly to maintain a breakdown voltage lower than 80V, the size of the entire device may be reduced. When an 80V breakdown voltage construction is applied, however, the size of an entire element grows larger than a case in which the thickness of the breakdown voltage-maintaining oxide layer 34 has been optimized, and as a result, problems occur in the characteristic of the device such as an increase in wiring resistance and the like around the element.

The gate area also grows larger than when the thickness of the breakdown voltage-maintaining oxide layer 34 has been optimized, with the result that parasitic gate capacitance rises and driving loss increases. Furthermore, in the manufacture of the aforementioned trench lateral power MOSFET 202, a shallow trench is dug and the lateral surfaces thereof are protected by a nitride film, whereupon a further, deeper trench is dug so that thermal oxidation can be performed. Thus, the manufacturing process to form the thick oxide film 34 for maintaining the breakdown voltage is complicated, which may lead to a deterioration in yield.

SUMMARY OF THE INVENTION

The present invention has been designed in view of the foregoing problems, and it is an object thereof to provide a semiconductor device comprising a trench lateral power MOSFET that is optimized for use with a lower breakdown voltage than 80V and a manufacturing method thereof in which manufacturing can be performed by a simpler process than that of a conventional 80V breakdown voltage trench lateral power MOSFET, and in which the device pitch and on-state resistance per unit area are lower than those of a conventional lateral power MOSFET for use with a lower breakdown voltage than 80V.

In order to achieve the aforementioned object, a trench and a drift region are formed on a semiconductor substrate of the present invention, and in a region corresponding to the active region, the bottom portion of the trench is selectively oxidized to form a thick gate insulating film. The gate insulating film is formed thinly along the lateral surfaces of the trench at a uniform thickness, and a first conductor, which serves as gate polysilicon, is formed inside the gate insulating film. Then, a base region and a source region are formed, a drain region is formed on the bottom portion of the trench, and a second conductor which serves as drain polysilicon is provided on the inner side of the first conductor via an interlayer insulating film. In this invention, the gate insulating film on the bottom portion of the trench becomes progressively thicker along the lower side of the gate polysilicon toward the drain polysilicon. In the case of a semiconductor device in which a trench MOSFET and a planar MOSFET are integrated on the same substrate, the step of selectively oxidizing the bottom portion of the trench and the step of performing selective oxidation in order to separate elements are integrated.

According to this invention, a MOSFET is formed in the side portions of the trench by self-alignment, and therefore accurate mask alignment is only necessary in the selective oxidation step on the bottom surface of the trench. Thus, the device pitch is reduced. Further, unlike in a conventional trench lateral power MOSFET for use with an 80V breakdown voltage, there is no need for a thick oxide film to maintain a high breakdown voltage, and hence the gate area and element size become smaller. Also, in the manufacturing process trench etching need only be performed once.

BRIEF DESCRIPTION OF THE DRAWINGS

The invention will be described with reference to certain preferred embodiments thereof along with the accompanying drawings, wherein.

DESCRIPTION OF THE PREFERRED EMBODIMENTS

Embodiments of the present invention will be described in detail herein below with ongoing reference to the drawings. Note that although an explanation is given below in which a first conductor is set as a p-type, and a second conductor is set as an n-type, the present invention is also applicable to an opposite case.

Embodiment 1.

Figure 1:
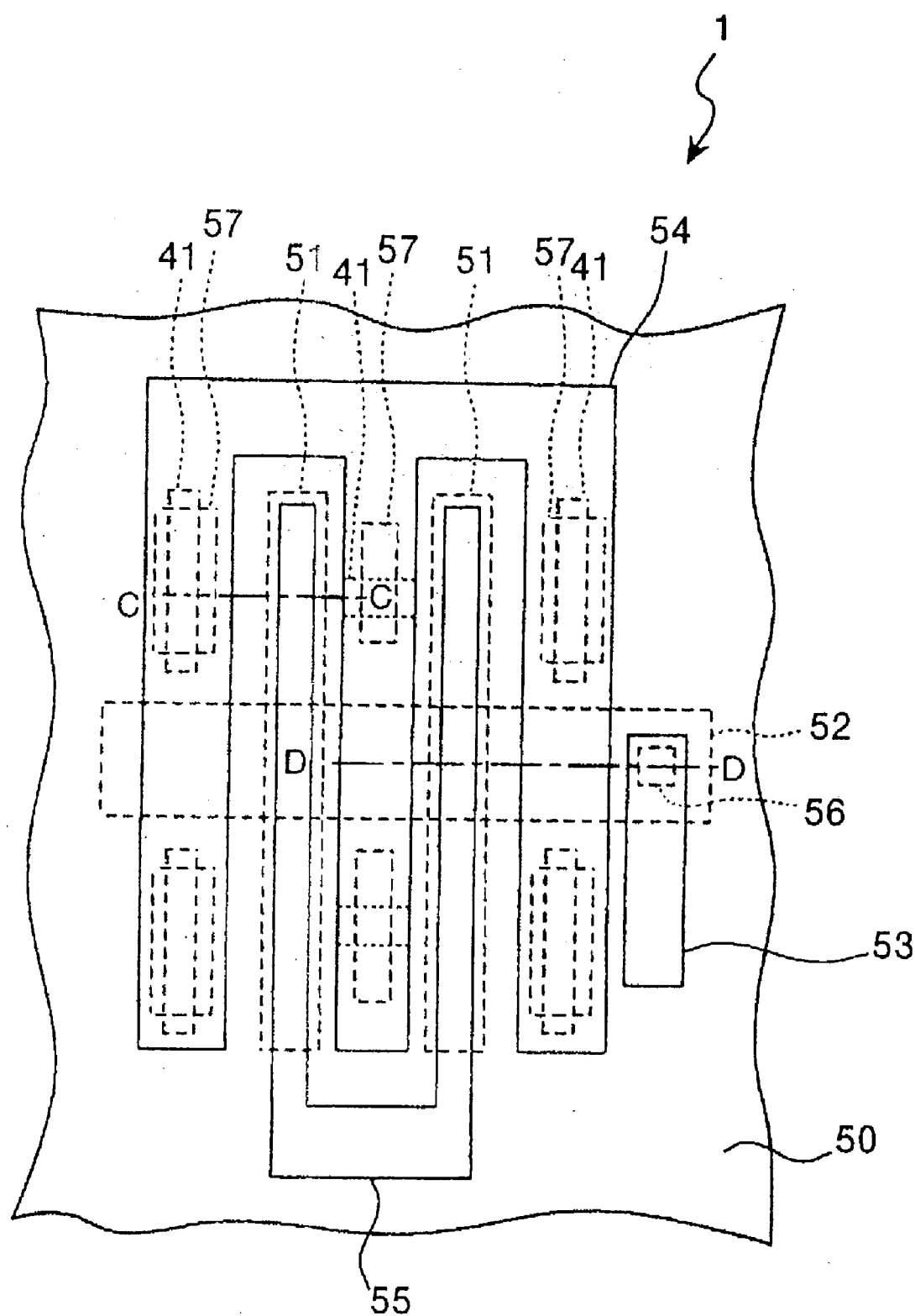
FIG. 1 is a plan view showing the main components of a trench lateral power MOSFET according to a first embodiment of the present invention.

FIG. 1 is a plan view showing the main components of a trench lateral power MOSFET according to a first embodiment of the present invention. As is illustrated in FIG. 1, this trench lateral power MOSFET 1 has a construction in which a plurality of trenches 51 are formed in a stripe formation on a p-type substrate 50, gate polysilicon 52 is formed so as to dissect these trenches 51, and a gate electrode 53, a comb-formation source electrode 54 and a comb-formation drain electrode 55 are formed on the substrate surface.

The gate polysilicon 52 is electrically connected to the gate electrode 53 via a contact portion 56. Although omitted from the drawing in FIG. 1, the drain electrode 55 is electrically connected to polysilicon inside the trenches 51 via a contact portion. This polysilicon is electrically connected to an n$^+$ diffusion region 58, which serves as a drain region on the bottom of the trenches 51. The source electrode 54 is electrically connected to an n$^+$ diffusion region 61, which serves as a source region via contact portions 57. In FIG. 1, the region of the substrate surface part excluding the trenches 51 is a p base region 62. The region of the substrate surface part excluding p$^+$ diffusion regions 41 and the trenches 51 is an n$^+$ diffusion region.

Figure 2:
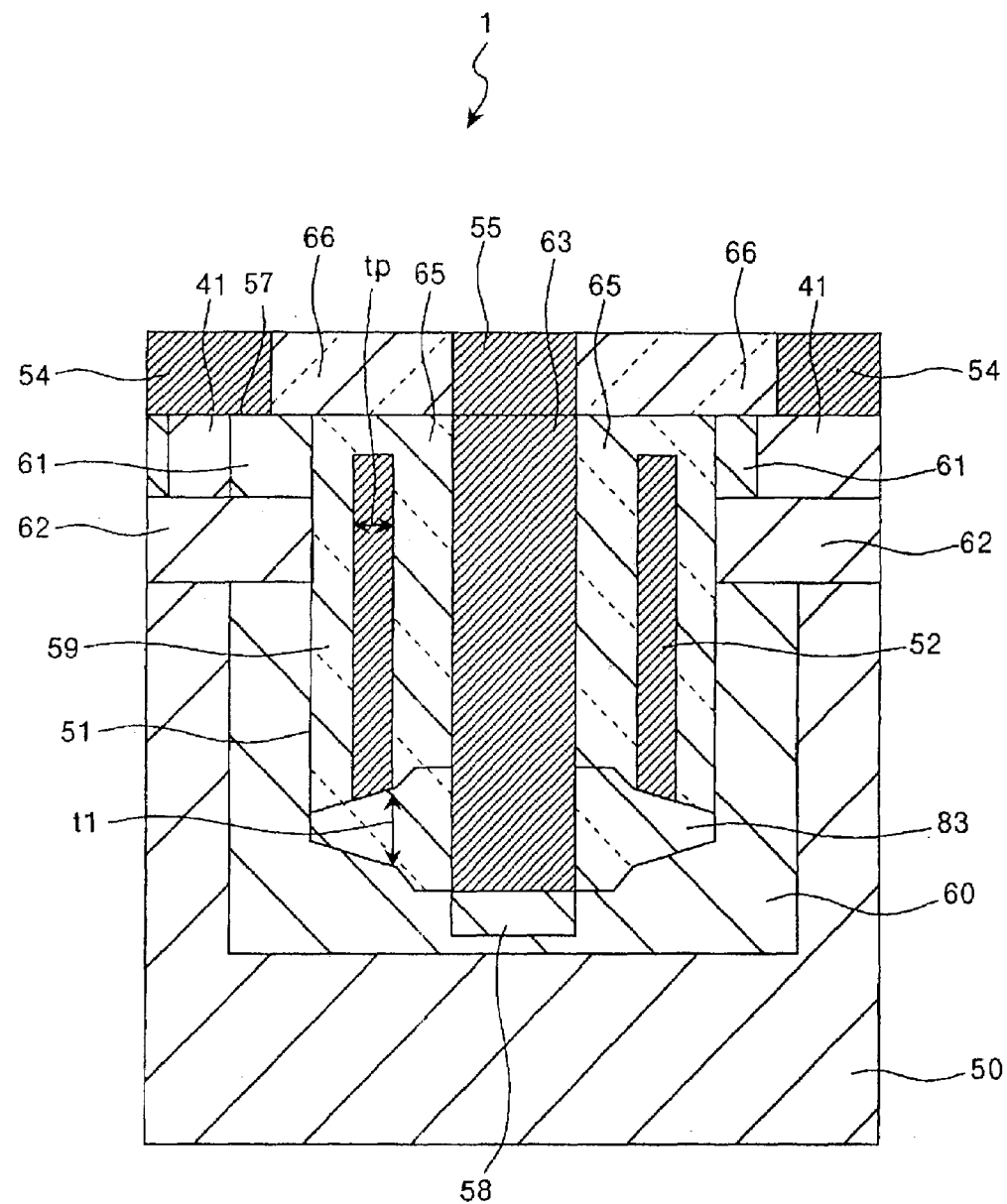
FIG. 2 is a sectional view along the C—C line in FIG. 1.

Next, the cross-sectional construction of the active region, which drives an electric current as a MOSFET, will be described. FIG. 2 is a sectional view along the C—C line in FIG. 1, illustrating the construction of the active region. A gate oxide film 59, which serves as a gate insulating film, is formed at a substantially uniform thickness along the lateral surfaces of the trench 51. This gate oxide film 59 also covers the bottom surface of the trench 51 and is thicker on the bottom surface of the trench 51 than on the lateral surfaces of the trench 51. The symbol 83 in FIG. 2 indicates the thick gate oxide film on the bottom surface part. Gate polysilicon 52 which serves as a first conductor is formed along the inside of the gate oxide film 59 substantially from top to bottom of the trench 51. This gate polysilicon 52 extends to a gate region which will be explained herein below in relation to FIG. 3.

The region outside of the lower half of the trench 51 is an n diffusion region 60 which serves as an n-type drift region. In this n diffusion region 60, an n$^+$ diffusion region 58, which serves as a drain region, is provided in the central portion of the bottom of the trench 51. The n$^+$ diffusion region 58 (drain region) is electrically connected to the drain electrode 55 via drain polysilicon 63, which is provided inside the trench 51 and which serves as a second conductor. This drain polysilicon 63 is insulated from the gate polysilicon 52 by an interlayer oxide film 65 inside the trench 51 which serves as an interlayer insulating film.

The region on the outside of the upper half of the trench 51 is a p base region 62, and an n$^+$ diffusion region 61 which serves as a source region is formed in the substrate surface region above this p base region 62. The n$^+$ diffusion region 61 (source region) is electrically connected to the source electrode 54 which is formed on the substrate surface. The p base region 62 is electrically connected to the source electrode 54 via the p$^+$ diffusion region 41 in a different planar location where the n$^+$ diffusion region 61 is absent. In FIG. 2, the symbol 66 indicates an interlayer oxide film (interlayer insulating film).

Figure 3:
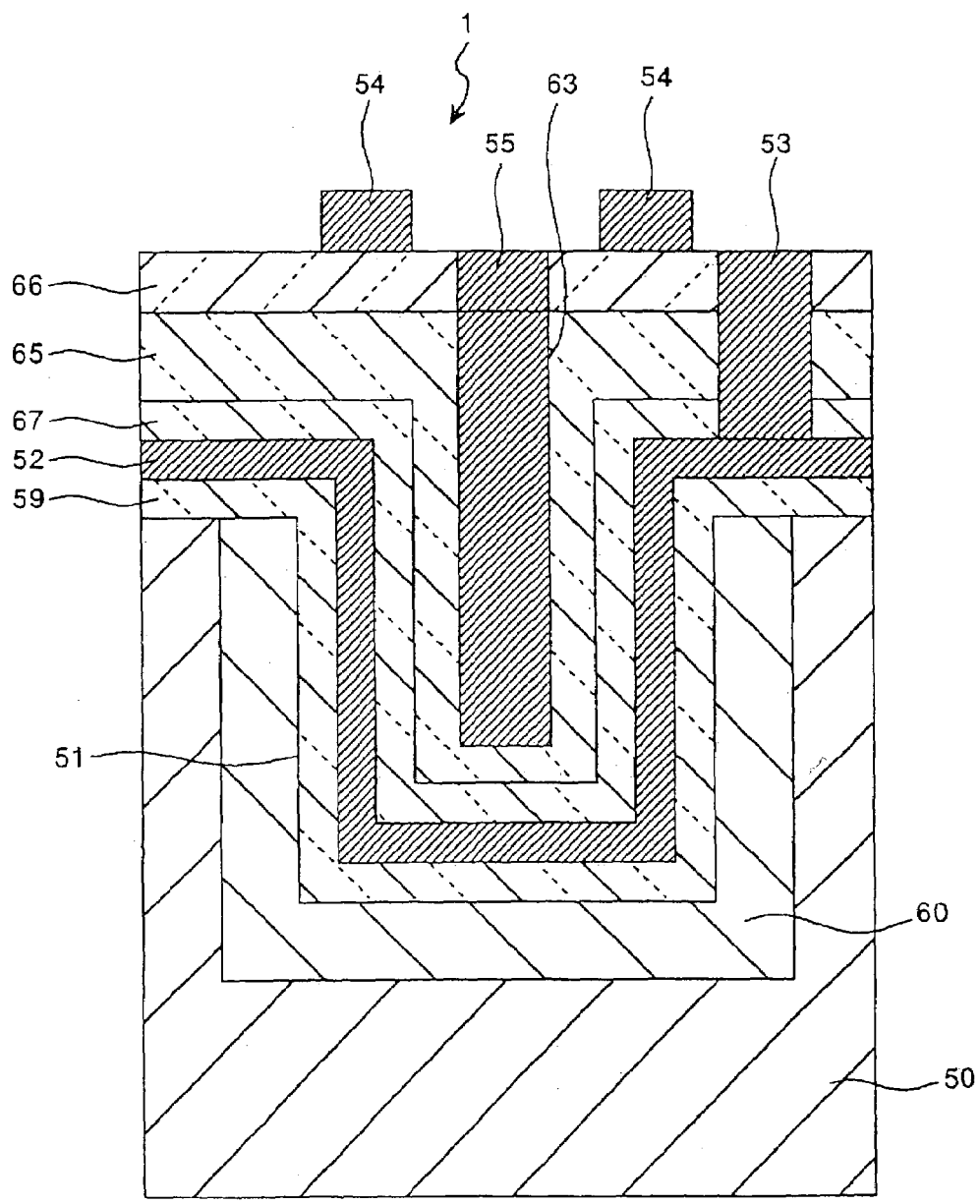
FIG. 3 is a sectional view along the D—D line in FIG. 1.

Next, the cross-sectional construction of the gate region on the substrate surface in which the gate polysilicon 52 is deposited will be explained. FIG. 3 is a sectional view along the D—D line in FIG. 1, illustrating the construction of the gate region. The region on the outside of the trench 51 is the aforementioned n diffusion region 60. The gate oxide film 59 is formed along the lateral surfaces and bottom surface of the trench 51. The gate oxide film 59 also covers the substrate surface. In FIG. 3, the gate oxide film 59 is formed at a uniform thickness along the lateral surfaces and the bottom surface of the trench 51. However, as in the construction of the active region shown in FIG. 2, the part of the gate oxide film 59 that covers the bottom surface of the trench 51 may be formed thicker than the trench lateral surface part. The gate polysilicon 52 is formed over the surface of the gate oxide film 59 on the substrate surface and the inner surfaces of the trench 51.

An interlayer oxide film 67 is laminated onto the gate polysilicon 52 on the surface of the gate polysilicon 52. The aforementioned drain polysilicon 63 is provided via the interlayer oxide film 65 in the part inside the trench 51 that is sandwiched by the interlayer oxide film 67. The interlayer oxide film 66 is formed between the drain electrode 55 on the drain polysilicon 63 and the gate electrode 53.

The gate region and active region constituted as above exist on the same element. In this case, the dimensions of each part and the surface concentration of impurities are as follows, although there are no particular limitations thereon. The trenches 51, for example, have a depth of 2 $\mu$m and a width of 3 $\mu$m. The pitch of the trenches 51 is 3 $\mu$m, for example, and the p base region 62 and the n$^+$ diffusion region 61 which serves as the source region are formed in the substrate surface regions between these 3 $\mu$m wide trenches 51. The diffusion depth of the p base region 62 is 1 $\mu$m, for example, and the surface concentration thereof is $1 \times 10^{18}$ cm$^{-3}$, for example. The n$^+$ diffusion region 58 (drain region) and the n$^+$ diffusion region 61 (source region) each has a diffusion depth of 0.2 $\mu$m and a surface concentration of $1 \times 10^{20}$ cm$^{-3}$, for example. The diffusion depth of then diffusion region 60 (drift region) is 2 $\mu$m and the surface concentration thereof is $2 \times 10^{16}$ cm$^{-3}$, for example.

The thickness of the gate oxide film 59 on the lateral surfaces of the trenches 51 is 0.02 $\mu$m, for example. The thickness of the gate oxide film 83 on the bottom surfaces of the trenches 51 becomes progressively thicker along the lower side of the gate polysilicon 52 toward the drain polysilicon 63 which serves as the drain electrode. If the thickness of the gate oxide film 83 at the point nearest the drain polysilicon 63 on the lower side of the gate polysilicon 52 is assumed to bet1 (see FIG. 2), then t1 is 0.22 $\mu$m, for example. If the thickness of the gate polysilicon 52 is assumed to be tp (see FIG. 2), then tp is 0.3 $\mu$m, for example.

Figure 4:
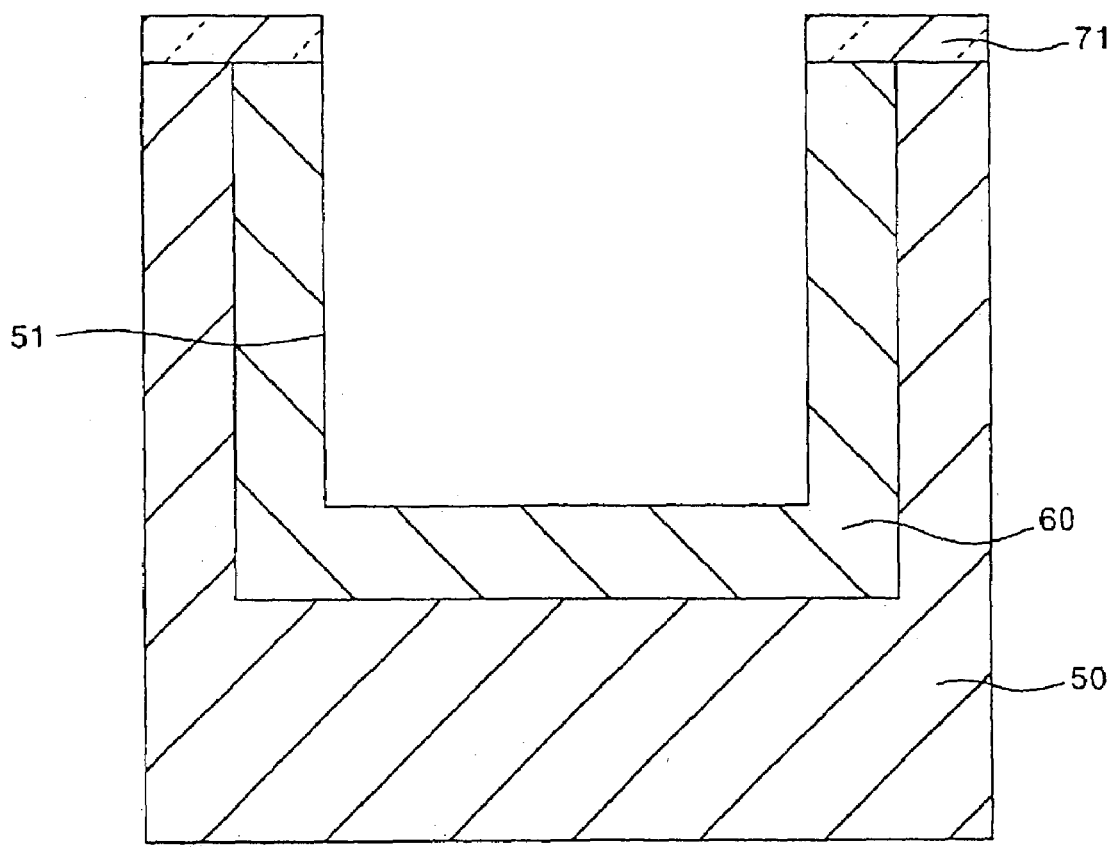
FIG. 4 is a sectional view showing the main parts of a stage of manufacture of the trench lateral power MOSFET according to the first embodiment of the present invention.

Next, the manufacturing process of a trench lateral power MOSFET 1 according to the first embodiment will be described. FIGS. 4 through 14 are sectional views showing the main parts in the stages of manufacture of the trench lateral power MOSFET 1. However, in these drawings only one trench 51 is illustrated. First, a mask oxide film 71 with a thickness of 1 $\mu$m, for example, is grown on the surface of the p-type substrate 50 which has a resistivity of 12 $\Omega$cm. A part of this mask oxide film 71 is selectively removed to open a trench forming portion. With this patterned mask oxide film 71 serving as a mask, a plurality of trenches 51 with opening widths of 3 $\mu$m, for example, are formed at intervals of 3 $\mu$m, for example, by RIE (reactive ion etching). Then, by means of oblique ion implantation, the n diffusion region 60 which serves as the drift region is formed on the lateral surface and bottom surface parts of the trench 51 on the substrate 50 (FIG. 4).

Figure 5:
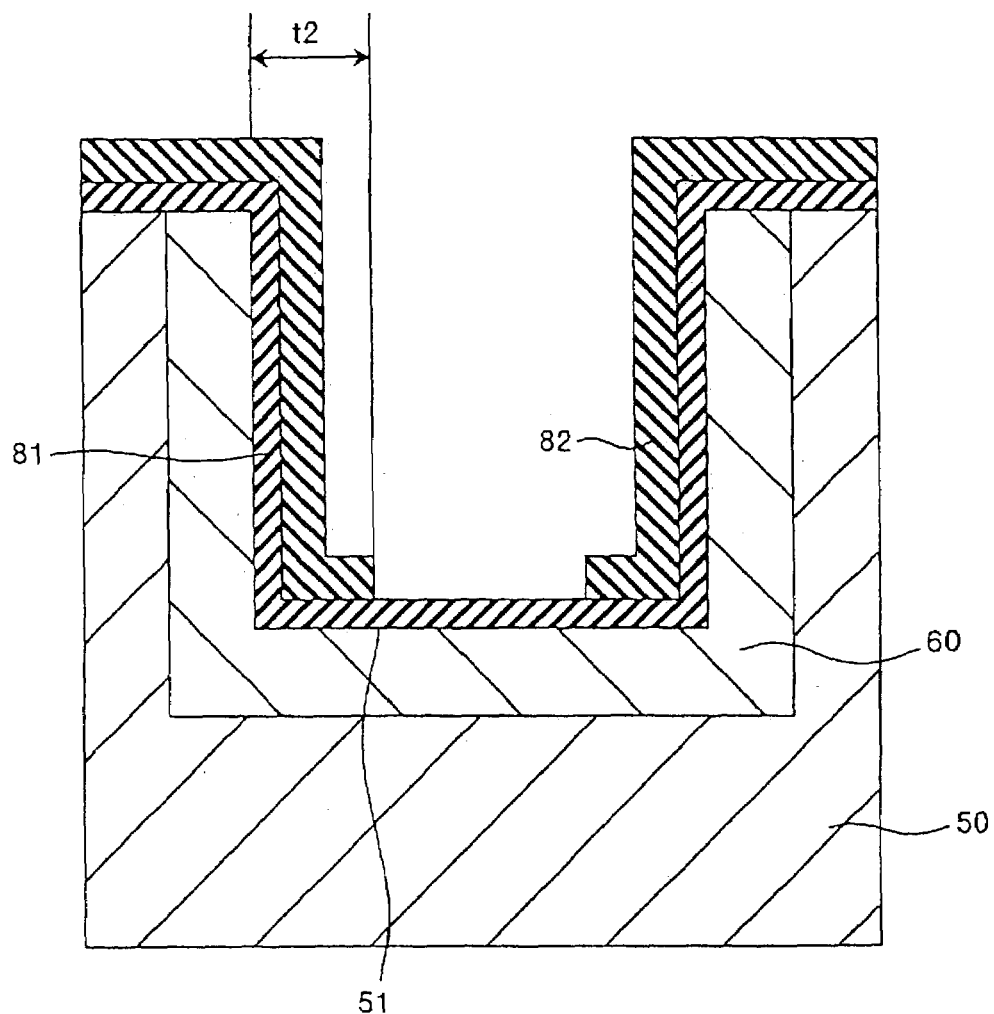
FIG. 5 is a sectional view showing the main parts of a stage of manufacture of the trench lateral power MOSFET according to the first embodiment of the present invention.

After the mask oxide film 71 has been removed, a buffer oxide film 81 with a thickness of 0.03 $\mu$m, for example, is formed, and a nitride film 82 with a thickness of 0.15 $\mu$m, for example, is deposited thereabove. Photoresist is then applied, whereupon the photoresist in one part of the bottom surface part of the trench 51 in the active region is selectively removed by exposure and development to form a resist mask. Using this resist mask, one part of the nitride film 82 on the bottom surface of the trench 51 in the active region is removed. At this point, the nitride film on the bottom surface of the trench 51 in the gate region may be simultaneously removed. Then, the remaining resist mask is removed. As a result of this process, the buffer oxide film 81 is exposed in one part of the bottom surface of the trench 51 in the active region. If the distance between this exposed region of the buffer oxide film 81, or in other words the region in which the nitride film 82 on the bottom surface part of the trench 51 in the active region has been removed, and the edge of the bottom surface of the trench is assumed to be t2, then t2 is 0.5 $\mu$m or greater, for example (FIG. 5).

Figure 6:
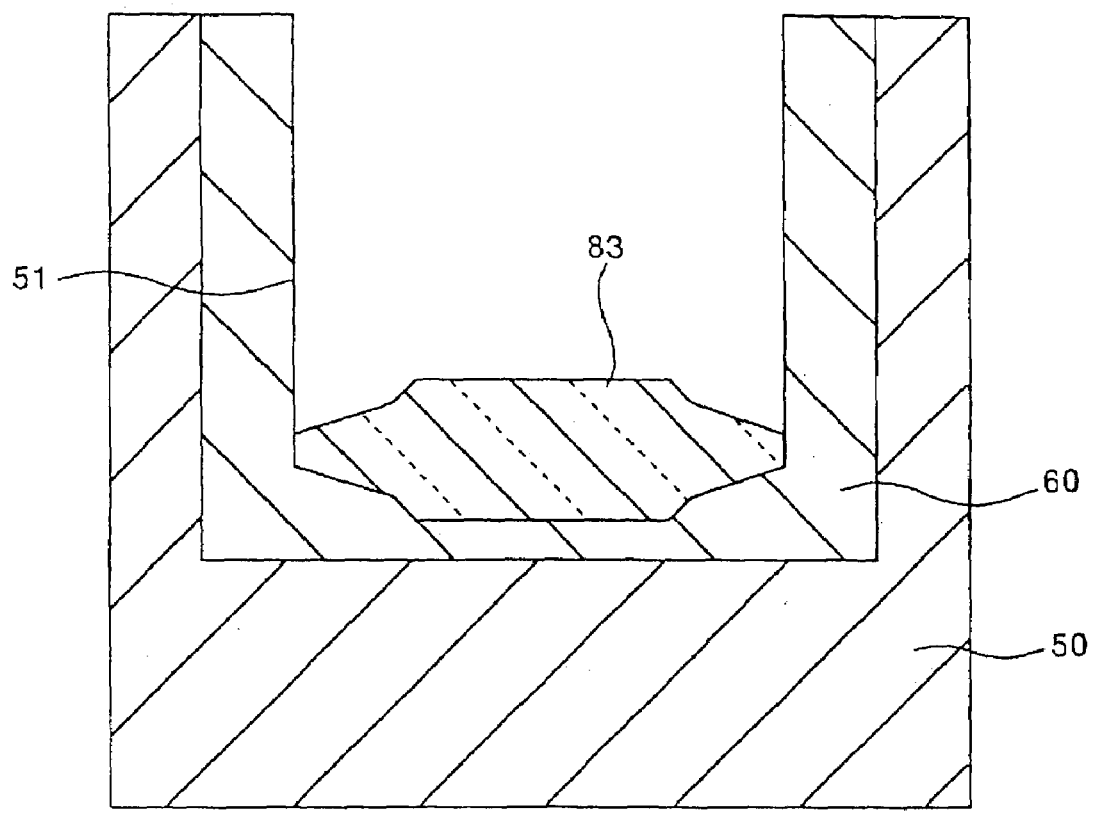
FIG. 6 is a sectional view showing the main parts of a stage of manufacture of the trench lateral power MOSFET according to the first embodiment of the present invention.

Next, thermal oxidation is performed at 1000° C., for example, with the residual nitride film 82 serving as a mask, to form a selectively oxidized film with a thickness of 0.6 $\mu$m, for example, in the opening portion of the nitride film 82. This selectively oxidized film forms the thick gate oxide film 83 on the bottom surface part of the trench. The nitride film 82 and the buffer oxide film 81 are then removed (FIG. 6).

Figure 7:
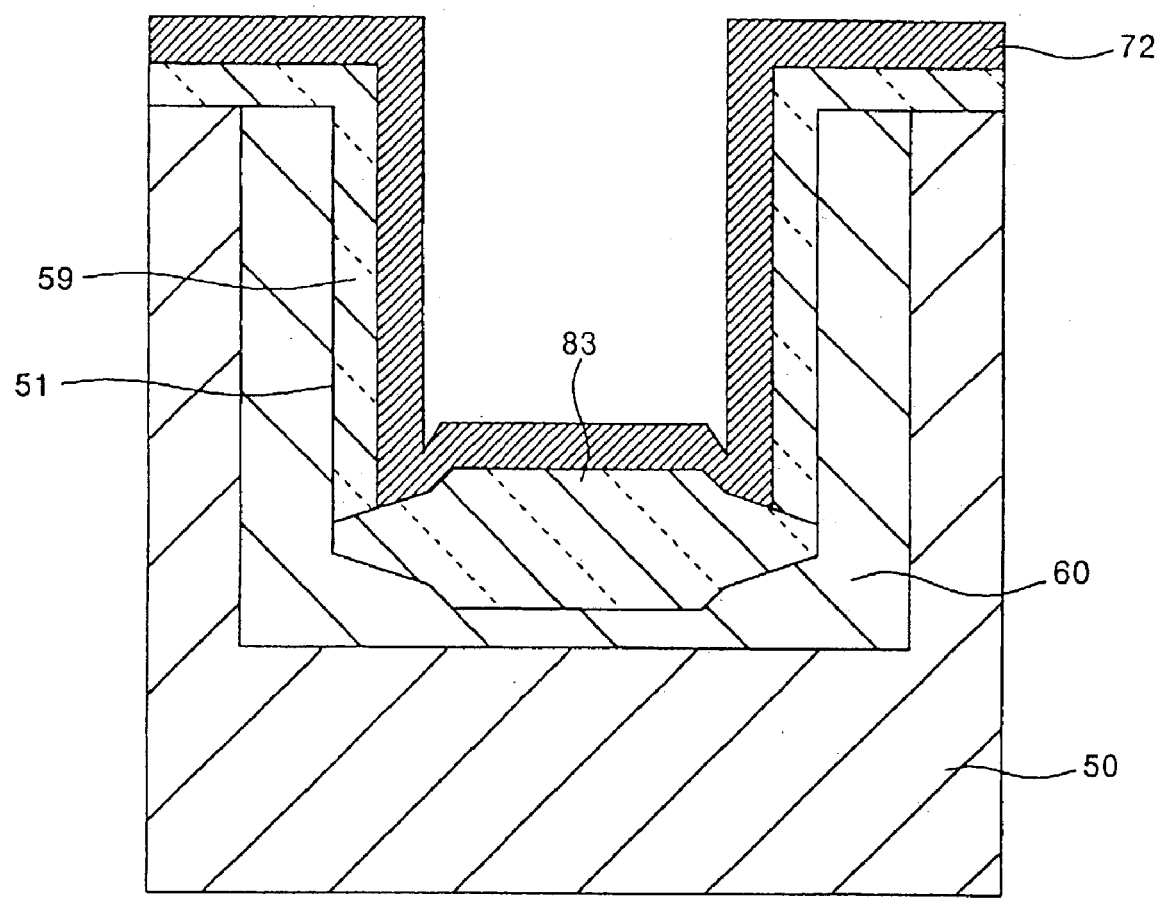
FIG. 7 is a sectional view showing the main parts of a stage of manufacture of the trench lateral power MOSFET according to the first embodiment of the present invention.
Figure 8:
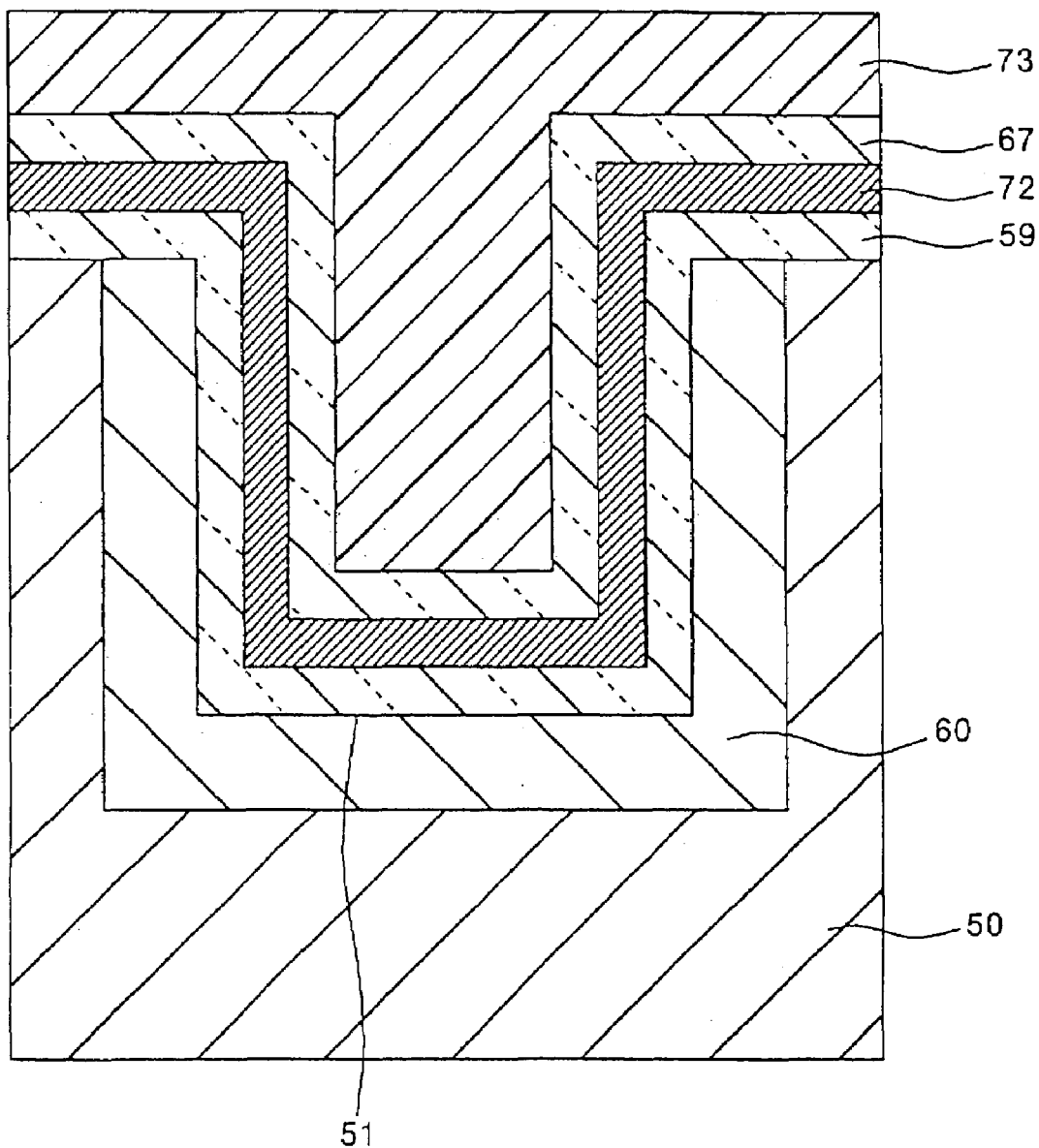
FIG. 8 is a sectional view showing the main parts of a stage of manufacture of the trench lateral power MOSFET according to the first embodiment of the present invention.

Next, the lateral surfaces of the trench 51 are purified by sacrificial oxidation, whereupon the gate oxide film 59 is formed at a thickness of 0.02 $\mu$m, for example, on the lateral surfaces and bottom surface of the trench 51. The gate oxide film 59 extends over the surface of the substrate. Thereafter, polysilicon 72 is deposited onto the gate oxide film 59 at a thickness of 0.3 $\mu$m, for example. An interlayer oxide film 67 is then deposited onto the polysilicon 72 at a thickness of 0.4 $\mu$m, for example. Photoresist is then applied, and a resist mask 73 is selectively formed in the gate region only by exposure and development of the photoresist. In the active region the resist is removed. This resist mask 73 is used to selectively remove the interlayer oxide film 67. Through this process, the interlayer oxide film 67 in the active region is removed to expose the polysilicon 72 (FIG. 7). In the gate region, meanwhile, the interlayer oxide film 67 and the resist mask 73 remain as they are (FIG. 8).

Next, the residual resist mask 73 is removed and the polysilicon 72 is etched back by an isotropic etching. Through this process, the polysilicon 72 in the active region apart from that on the lateral surfaces of the trench 51 is removed such that the polysilicon 72 remains only on the lateral surfaces of the trench 51. This residual polysilicon 72 forms the gate polysilicon 52 in the active region. In this etching process, the upper edges of the residual polysilicon 72 in the active region is over-etched so as to be lower than the surface of the trench 51, or in other words lower than the initial substrate surface. Thus, the upper edge of the polysilicon 72 becomes lower than the upper face of the gate oxide film 59 on the substrate surface by a dimension of tov (where tov is the amount of over-etching).

Figure 9:
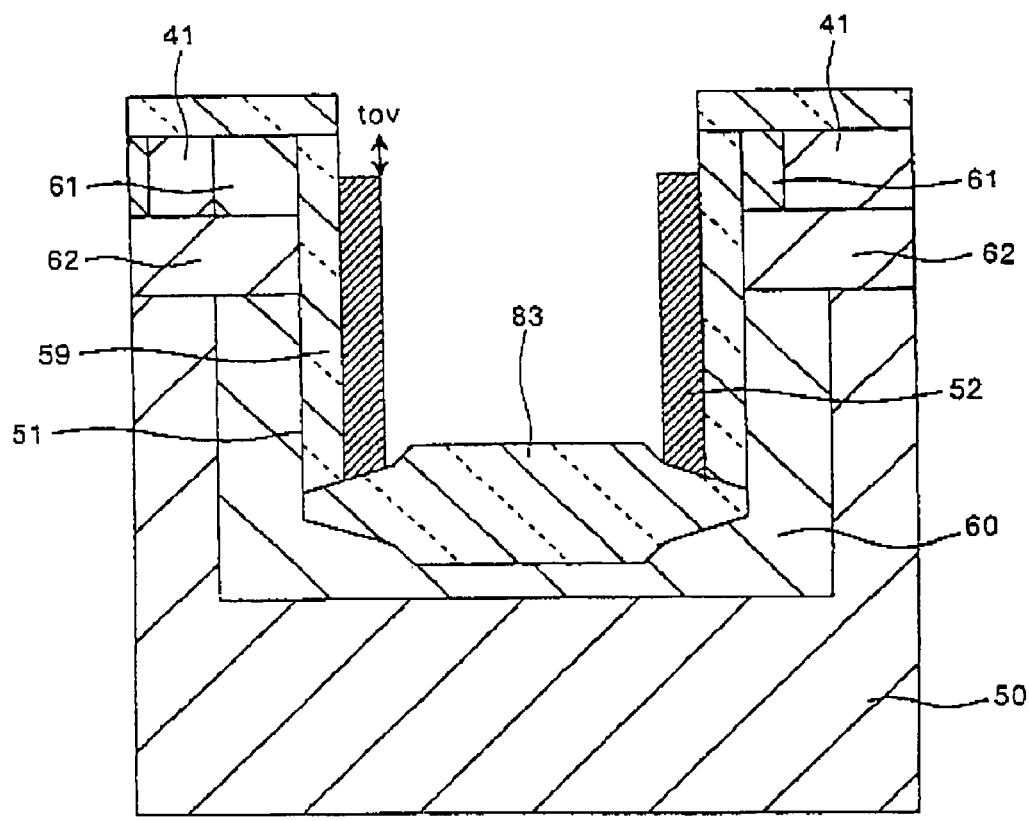
FIG. 9 is a sectional view showing the main parts of a stage of manufacture of the trench lateral power MOSFET according to the first embodiment of the present invention.
Figure 10:
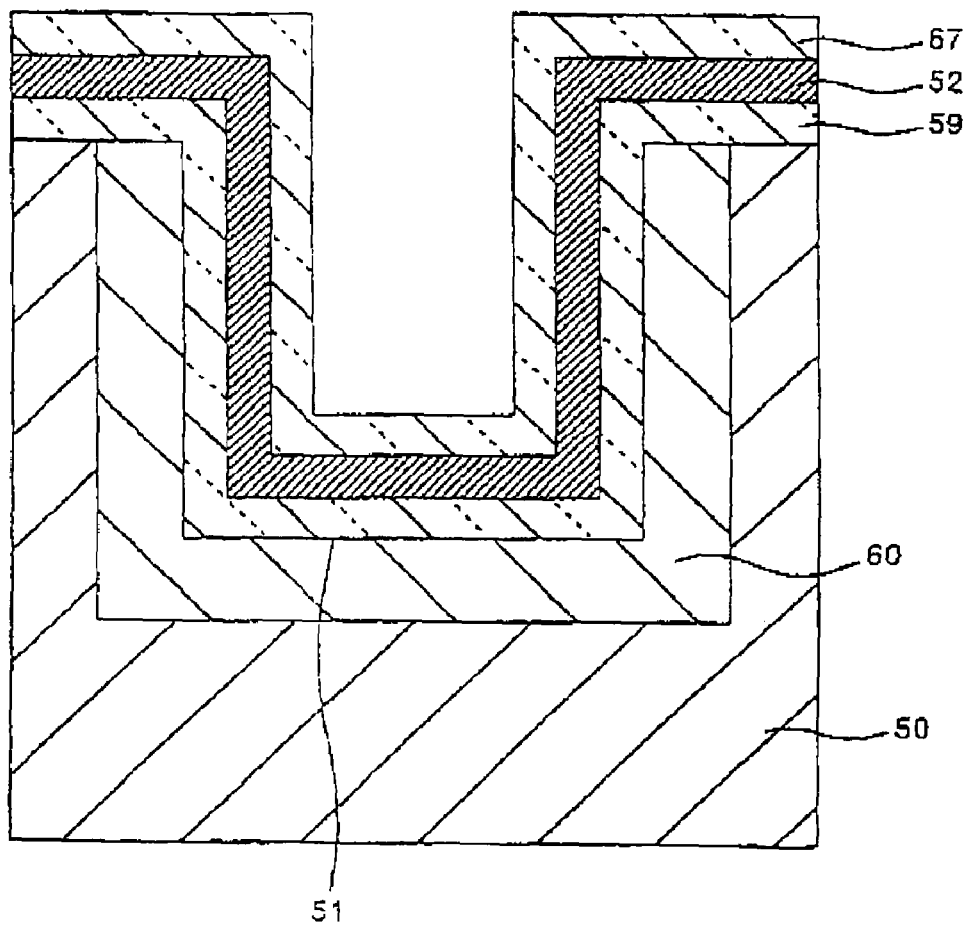
FIG. 10 is a sectional view showing the main parts of a stage of manufacture of the trench lateral power MOSFET according to the first embodiment of the present invention.
Figure 11:
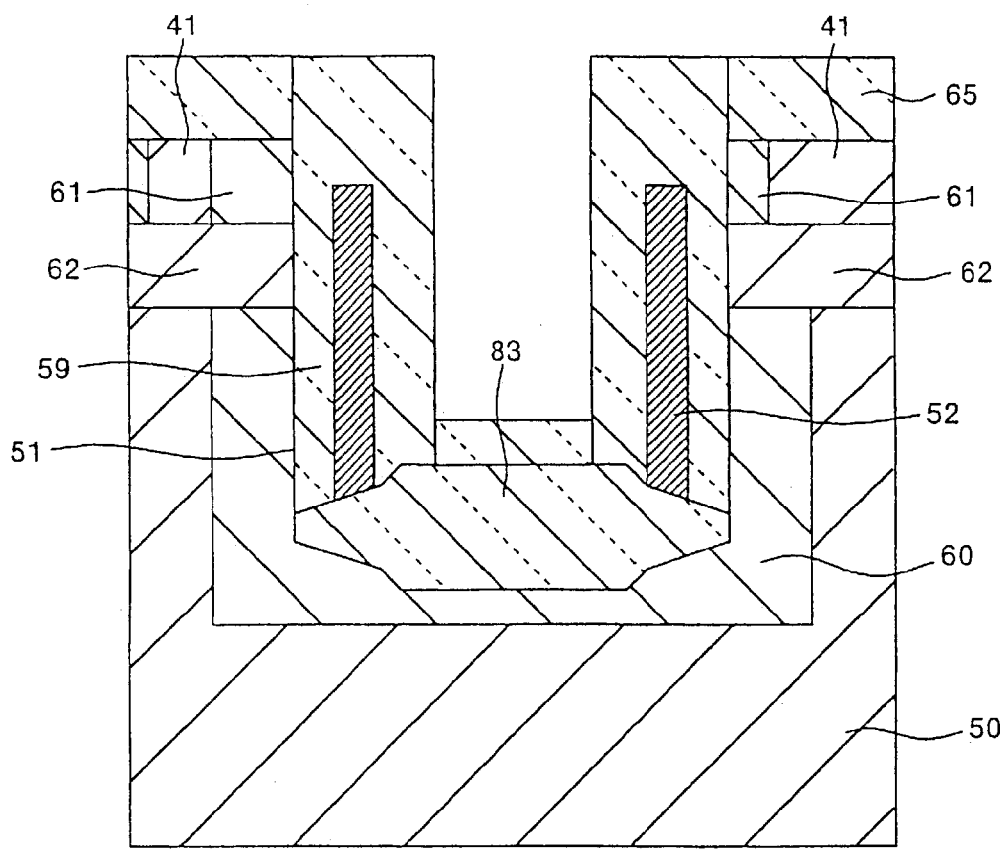
FIG. 11 is a sectional view showing the main parts of a stage of manufacture of the trench lateral power MOSFET according to the first embodiment of the present invention.

Then, following ion implantation on the substrate surface, a drive-in is performed. As a result, in the active region, the p base region 62 is formed at, for example, a diffusion depth of 1 $\mu$m and a surface concentration of $1\times10^{18}$ cm$^{-3}$, the n$^+$ diffusion region 61 (source region) is formed at, for example, a diffusion depth of 0.2 $\mu$m and a surface concentration of $1\times10^{20}$ cm$^{-3}$, and the p$^+$ diffusion region 41 is formed at, for example, a diffusion depth of 0.2 $\mu$m and a surface concentration of $1\times10^{20}$ cm$^{-3}$. The n$^+$ diffusion region 61 and the p$^+$ diffusion region 41 are separated using an appropriate resist mask during ion implantation (FIG. 9). In the gate region, meanwhile, etching of the polysilicon 72 is prevented by the interlayer oxide film 67, and hence the polysilicon 72 remains as is, serving as the gate polysilicon 52 (FIG. 10).

Figure 12:
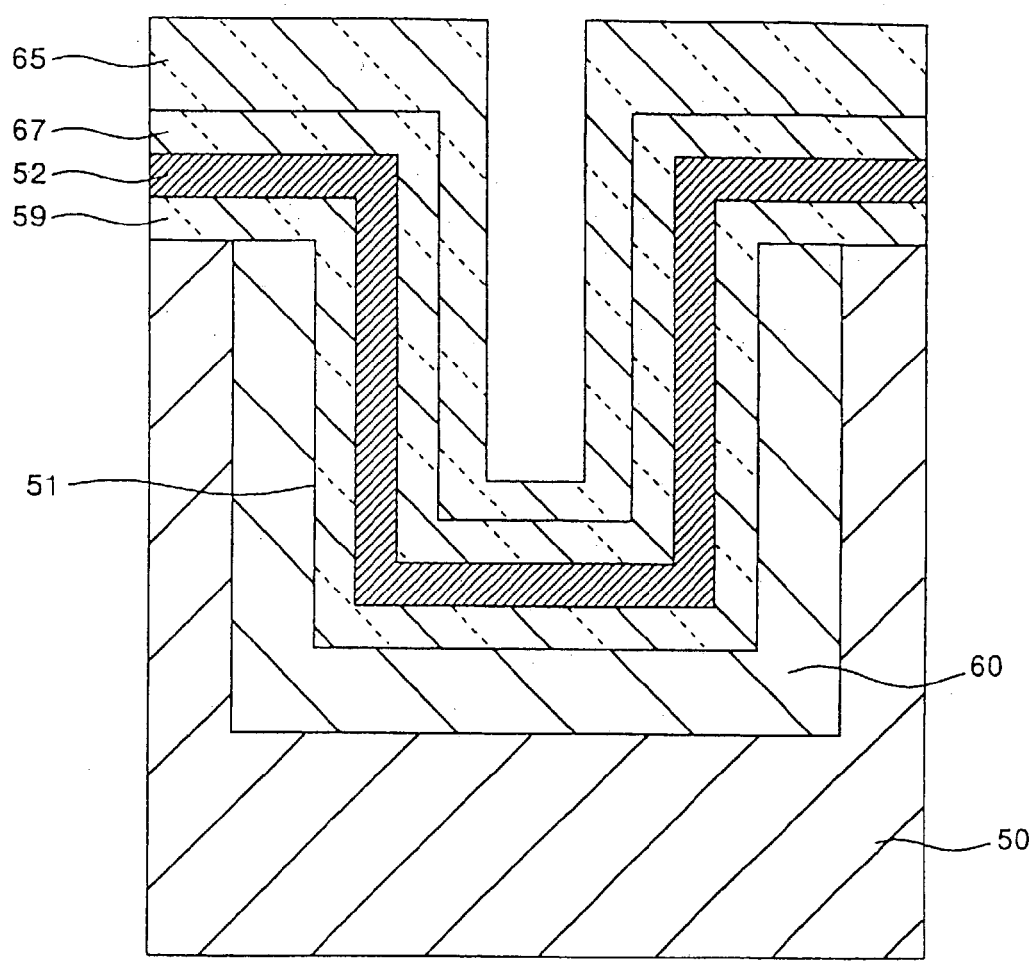
FIG. 12 is a sectional view showing the main parts of a stage of manufacture of the trench lateral power MOSFET according to the first embodiment of the present invention.
Figure 13:
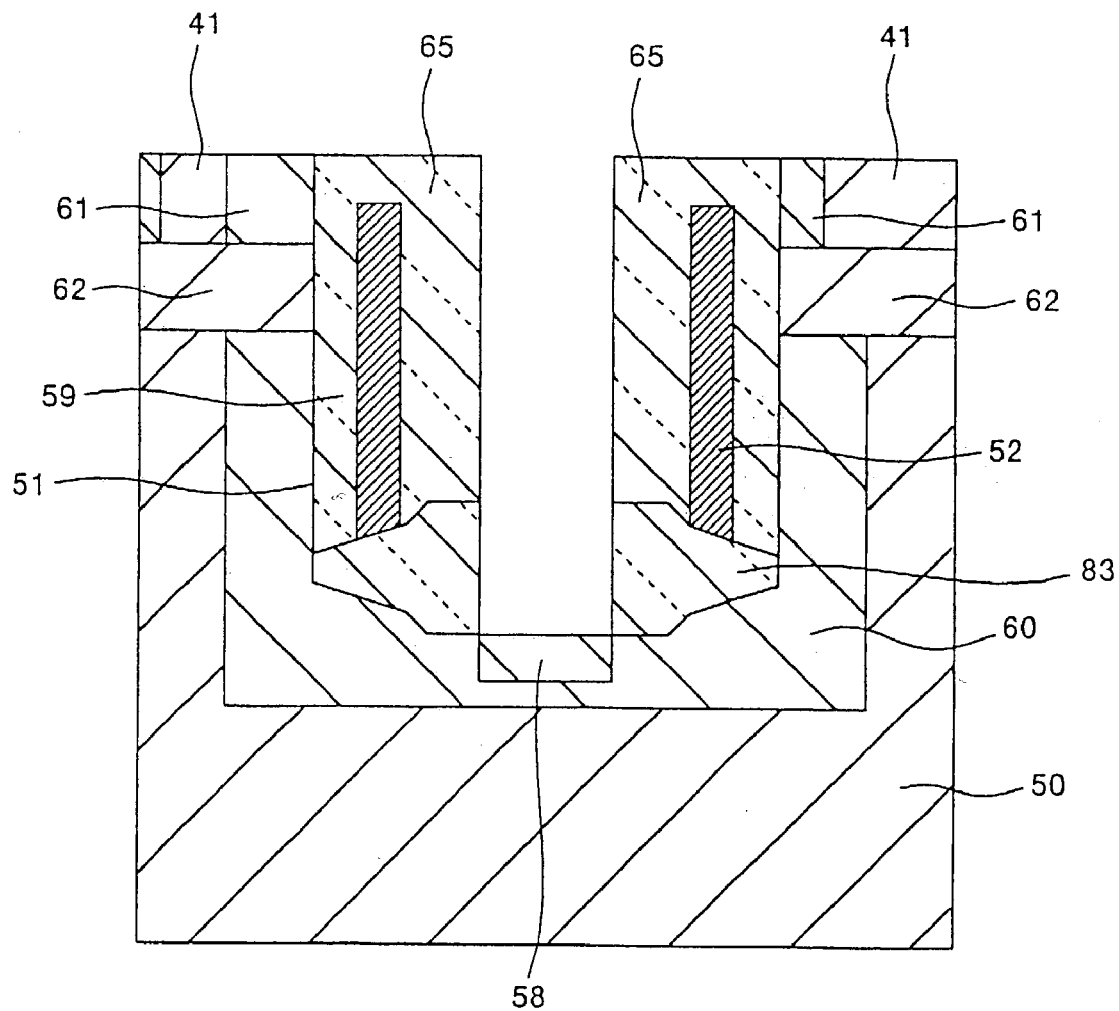
FIG. 13 is a sectional view showing the main parts of a stage of manufacture of the trench lateral power MOSFET according to the first embodiment of the present invention.

Next, the interlayer oxide film 65 is laminated by a film formation method such as LPCVD or P-TEOS in an atmosphere of approximately 400° C. By using such a film formation method, the growth rate of the interlayer oxide film 65 inside the trench 51 is approximately 50% of the growth rate of the interlayer oxide film 65 outside of the trench 51, or in other words on the substrate surface. As a result, the thickness of the part of the interlayer oxide film 65 deposited on the bottom surface of the trench 51 becomes thinner than the thickness of the part on the substrate surface (FIG. 11 (active region); FIG. 12 (gate region)).

Figure 14:
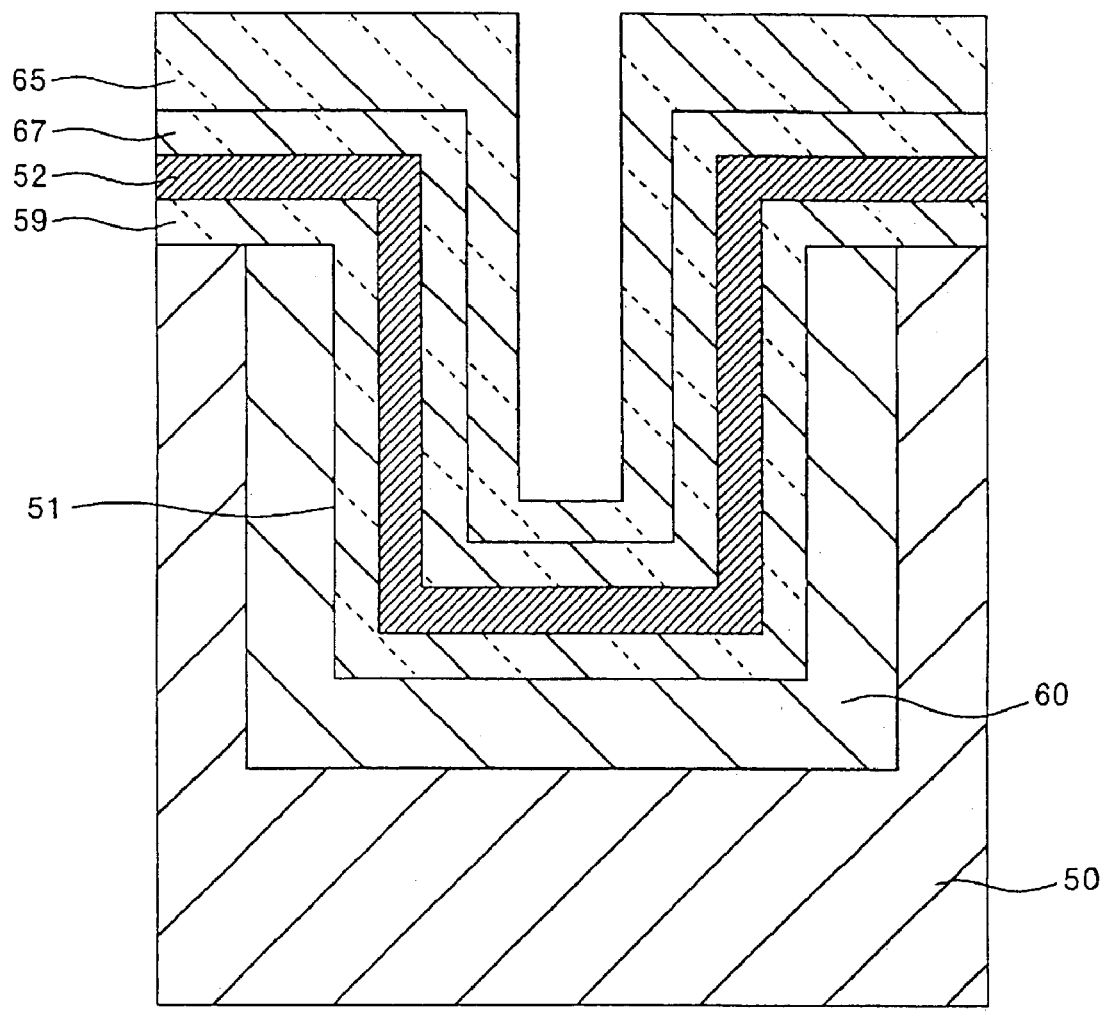
FIG. 14 is a sectional view showing the main parts of a stage of manufacture of the trench lateral power MOSFET according to the first embodiment of the present invention.

Photoresist is then applied, whereupon the photoresist in one part of the bottom surface of the trench 51 in the active region is removed by exposure and development to form a resist mask. Using this resist mask, one part of the interlayer oxide film 65 and the trench bottom surface thick gate oxide film 83 on the bottom surface of the trench 51 in the active region is selectively removed to form a contact hole passing through the interlayer oxide film 65 and the gate oxide film 83. Then the residual resist mask is removed. Next, the n$^+$ diffusion region 58, which serves as the drain region, is formed on the bottom portion of the trench 51 in the active region by ion implantation (FIG. 13 (active region); FIG. 14 (gate region)).

Note that instead of performing selective removal of the interlayer oxide film 65 by photolithography technology and etching, the contact hole may also be opened by removing the interlayer oxide film 65 and thick gate oxide film 83 through self-alignment due to the combination film thickness of the trench bottom surface thick gate oxide film 83, the polysilicon 72 serving as the gate polysilicon 52, and the interlayer oxide film 65.

Next, polysilicon 63 is deposited and etched back to be buried inside the trench 51, whereupon the interlayer insulating film 66 is formed over the whole surface thereof. Contact holes are opened in the interlayer insulating film 66 and metal is deposited to form the gate electrode 53, source electrode 54 and drain electrode 55. In performing all of the above steps, the trench lateral power MOSFET 1 is completed with the active region having the sectional construction as shown in FIG. 2 and the gate region having the sectional construction as shown in FIG. 3.

Figure 15:
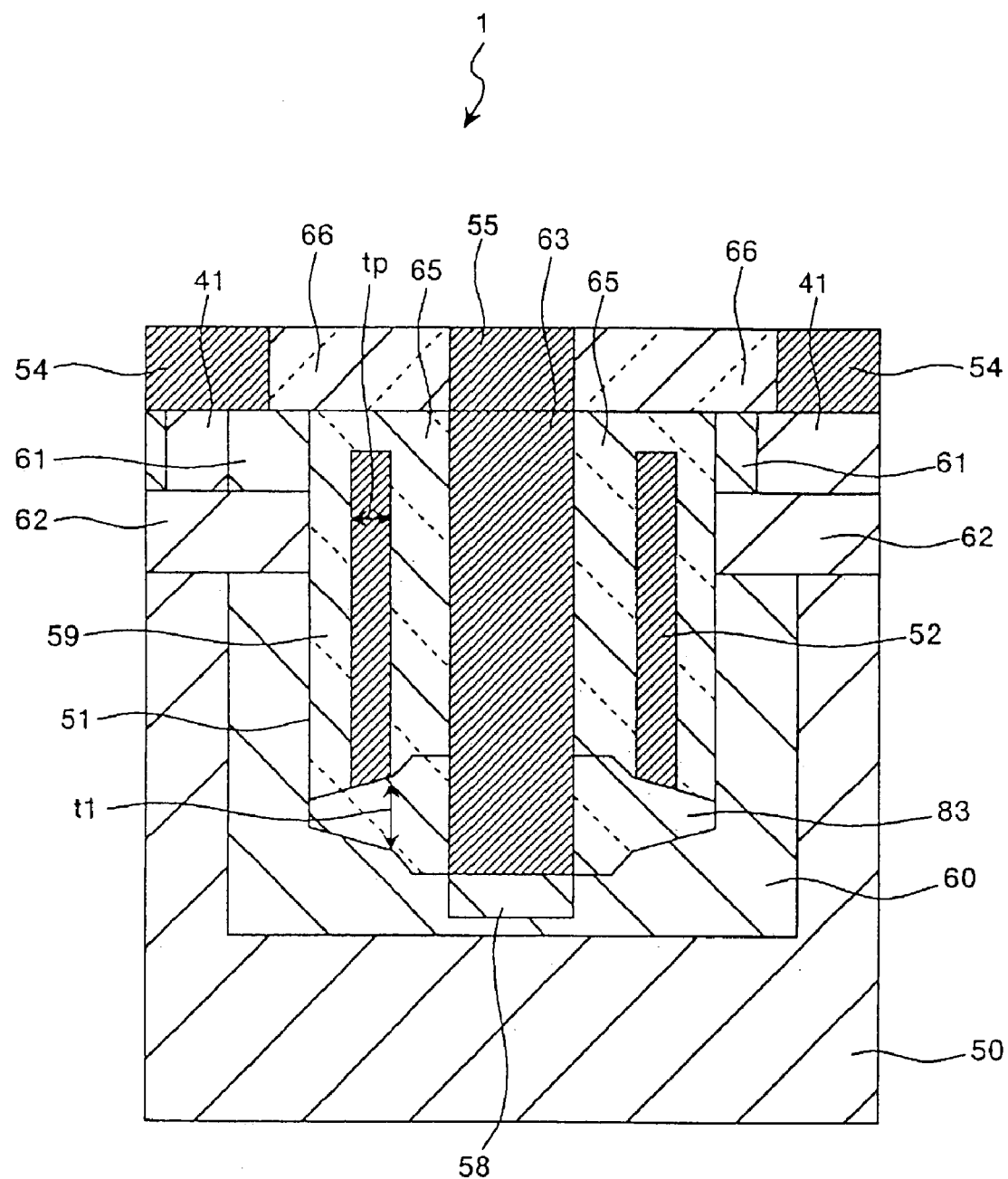
FIG. 15 is a sectional view showing an example of another cross-sectional construction along the C—C line in FIG. 1 of the trench lateral power MOSFET according to the first embodiment of the present invention.
Figure 16:
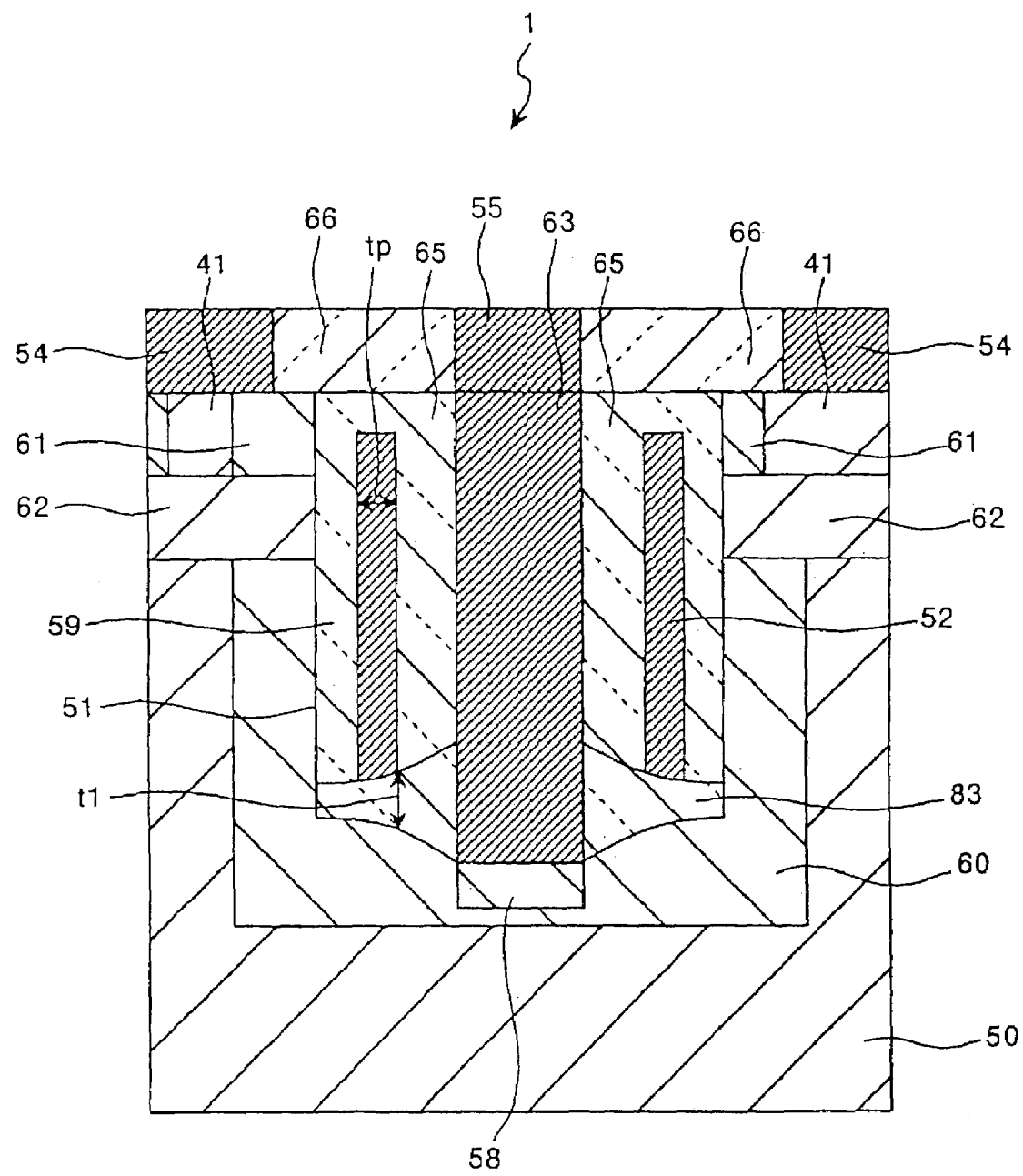
FIG. 16 is a sectional view showing an example of another cross-sectional construction along the C—C line in FIG. 1 of the trench lateral power MOSFET according to the first embodiment of the present invention.
Figure 17:
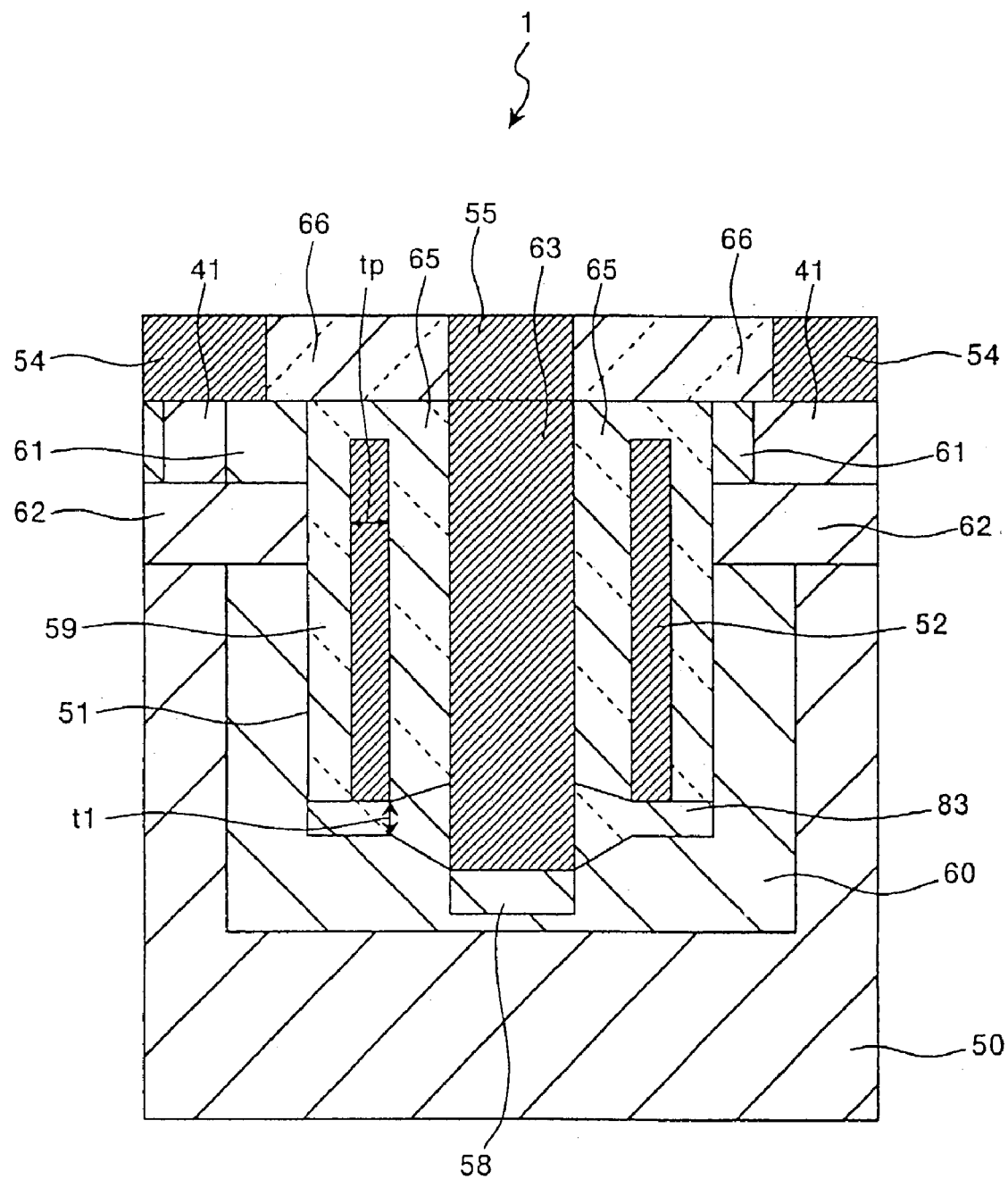
FIG. 17 is a sectional view showing an example of another cross-sectional construction along the C—C line in FIG. 1 of the trench lateral power MOSFET according to the first embodiment of the present invention.

Here, three modified examples of the combination of the aforementioned three parameters t1, t2 and tp are cited, and the longitudinal sectional constructions thereof along the C—C line in FIG. 1 are illustrated in FIGS. 15 through 17. In a first example shown in FIG. 15, t1=0.1 $\mu$m, t2≧0.7 $\mu$m, and tp=0.3 $\mu$m. In this first example, similarly to the sectional construction shown in FIG. 2, the gate oxide film 83 on the bottom surface of the trench 51 grows progressively thicker along the lower side of the gate polysilicon 52 toward the drain polysilicon 63.

In a second example, as is illustrated in FIG. 16, t1=0.04 $\mu$m, t2≧0.9 $\mu$m, and tp=0.3 $\mu$m. In this second example, the gate oxide film 83 on the bottom surface of the trench 51 grows progressively thicker along one part of the lower side of the gate polysilicon 52 toward the drain polysilicon 63 .

In a third example, as is illustrated in FIG. 17, t1=0.02 $\mu$m, t2≧1.0 $\mu$m, and tp=0.3 $\mu$m. In this third example, the thickness of the gate oxide film 83 on the bottom surface of the trench 51 is uniform along the lower side of the gate polysilicon 52. That is, the third example is one in which the gate oxide film 83 does not grow thicker along the lower side of the gate polysilicon 52 toward the-drain polysilicon 63.

Figure 18:
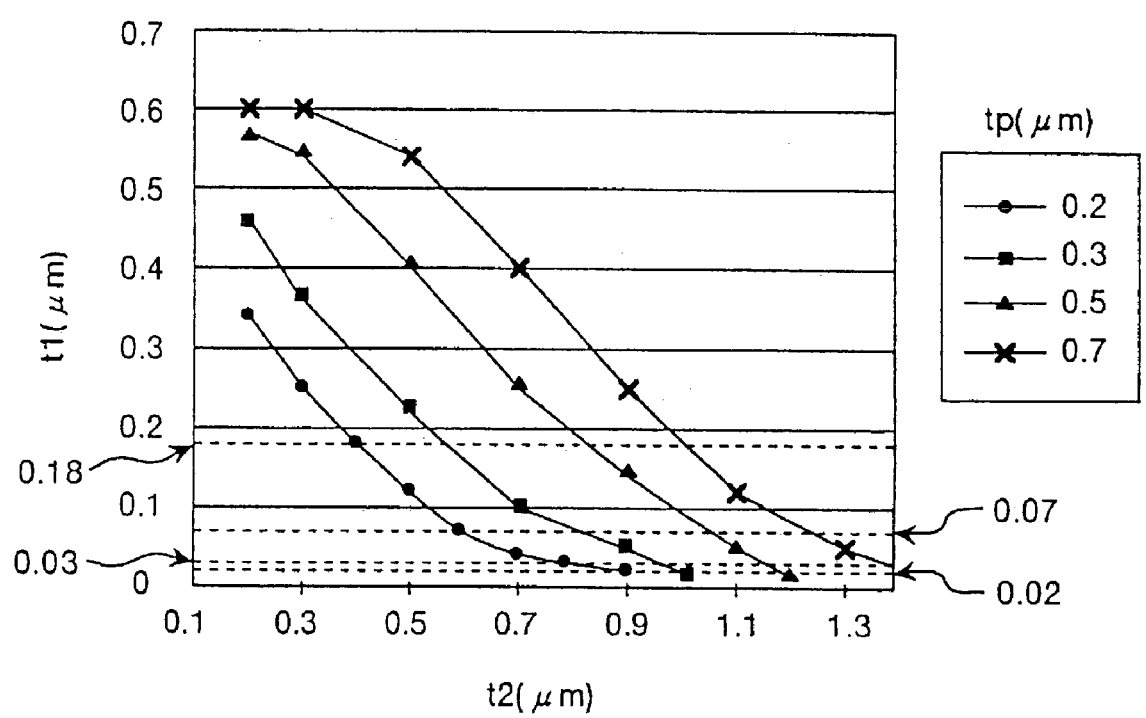
FIG. 18 is a characteristic graph showing the relationships among the 3 parameters t1, t2, and tp of the trench lateral power MOSFET according to the first embodiment of the present invention.

Next, the results of a consideration of the preferable range of or mutual relationship between the three parameters t1, t2, and tp will be explained. FIG. 18 is a characteristic view showing the result of an investigation into the value of t1 in the ranges of 0.2 $\mu$m$\leq$tp$\leq$0.7 $\mu$m and 0.18 $\mu$m$\leq$t2$\leq$1.4 $\mu$m. Here, the value of t2 is set at 0.18 $\mu$m or greater due to the fact that the sum total of the film thickness of the buffer oxide film 81 and the film thickness of the nitride film 82 is 0.18 $\mu$m.

As can be seen from FIG. 18, the value of t1 when t2=tp+0.7 $\mu$m is 0.02 $\mu$m. In other words, the thickness t1 of the gate oxide film 83 at the closest point to the drain polysilicon 63 on the lower side of the gate polysilicon 52 is 0.02 $\mu$m. As noted above, the thickness of the part of the gate oxide film 59, which covers the lateral surfaces of the trench 51, is 0.02 $\mu$m. Thus, when t2=tp+0.7 $\mu$m, the thickness of the gate oxide film 83 at the closest point to the drain polysilicon 63 on the lower side of the gate polysilicon 52 is the same as the thickness of the gate oxide film 59 covering the lateral surfaces of the trench 51.

When t2=tp+0.6 $\mu$m, the value of t1 is at least 0.03 $\mu$m. When t2=tp+0.4 $\mu$m, the value of t1 is at least 0.07 $\mu$m. When t2=tp+0.2 $\mu$m, the value of t1 is at least 0.18 $\mu$m. That is, if the value of t2 satisfies 0.18 $\mu$m$\leq$t2$\leq$tp+0.6 $\mu$m, the thickness of the gate oxide film 83 at the closest point to the drain polysilicon 63 on the lower side of the gate polysilicon 52 will be thicker than the thickness of the part of the gate oxide film 59 covering the lateral surfaces of the trench 51.

Further, in an investigation of the breakdown voltage of the trench lateral power MOSFET, the breakdown voltage is highest when the value of t2 is 0.18 $\mu$m$\leq$t2$\leq$tp+0.2 $\mu$m, is next highest when tp+0.2 $\mu$m$\leq$t2$\leq$tp+0.4 $\mu$m, and is next highest when tp+0.4$\leq$t2$\leq$tp+0.6 $\mu$m. The reasons for this improvement in the breakdown voltage are the increase in the film thickness of the gate oxide film 83 in the vicinity of the drain polysilicon 63, and the fact that upon selective oxidation to create the gate oxide film 83, the trench corner portion on the bottom surface of the trench 51 becomes rounded. Further, the reason for the successive increase in the breakdown voltage as noted above is that the film thickness of the gate oxide film 83 in the vicinity of the drain polysilicon 63 grows thicker in similar succession.

Figure 19:
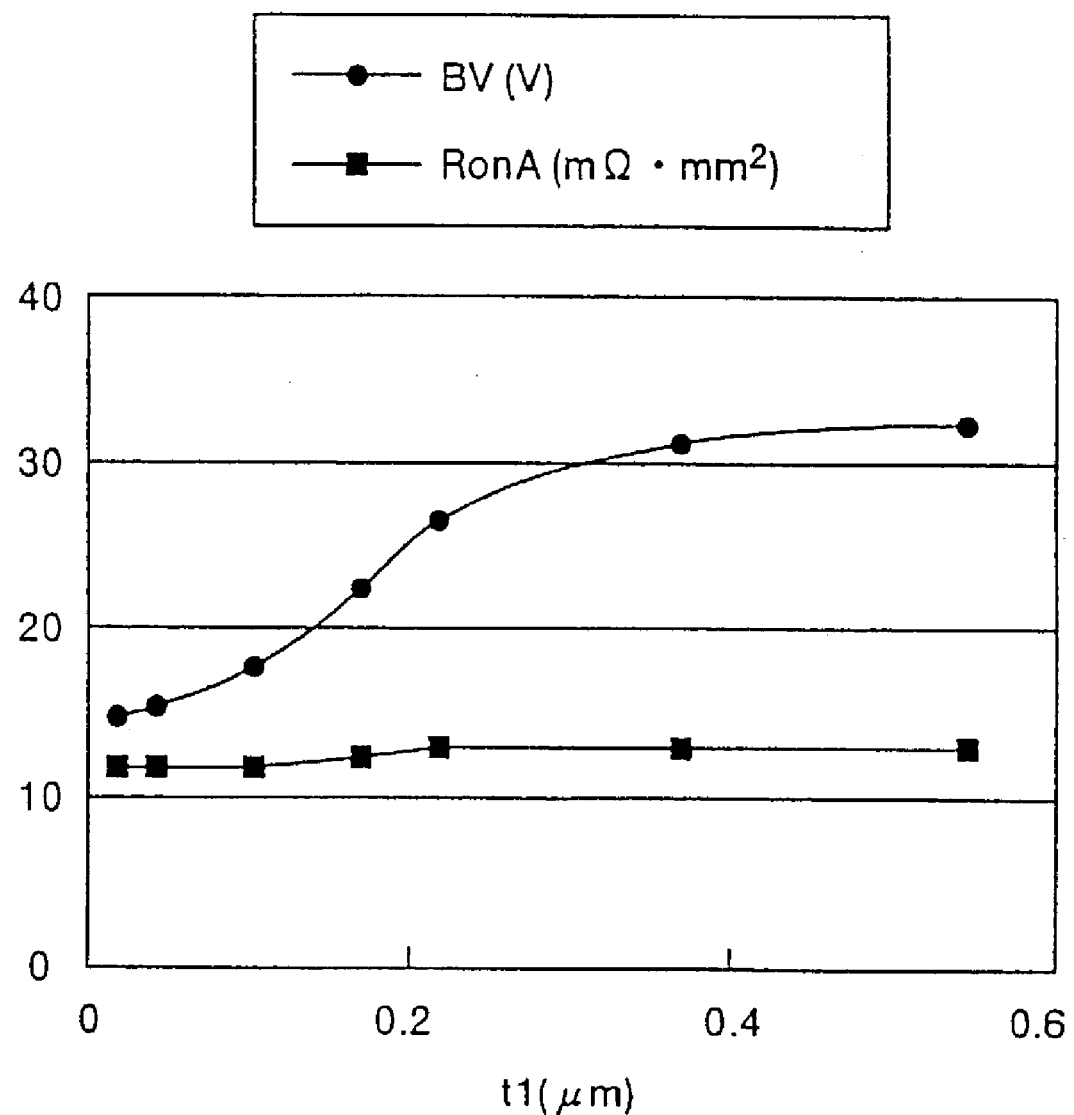
FIG. 19 is a characteristic graph showing the relationship of the on-state resistance and breakdown voltage of the trench lateral power MOSFET according to the first embodiment of the present invention with t1.

FIG. 19 is a characteristic view showing the relationship of the on-state resistance RonA and breakdown voltage BV of the trench lateral power MOSFET of the first embodiment with the aforementioned parameter t1. Here, the film thickness tp of the gate polysilicon 52 is set at 0.3 $\mu$m. The on-state resistance is substantially constant at approximately 13 m$\Omega$·mm$^2$, regardless of the value of t1. The reason that the on-state resistance is substantially constant is that resistance in the channel region of the p base region 62 which faces the gate oxide film 59 on the side walls of the trench controls the on-state resistance. The breakdown voltage is 15V when the value of t1 is the same as the film thickness of the gate oxide film 59 on the side walls of the trench (0.02 $\mu$m), and becomes higher as t1 increases, exceeding 30V when the value of t1 is 0.37 $\mu$m or greater.

Figure 31:
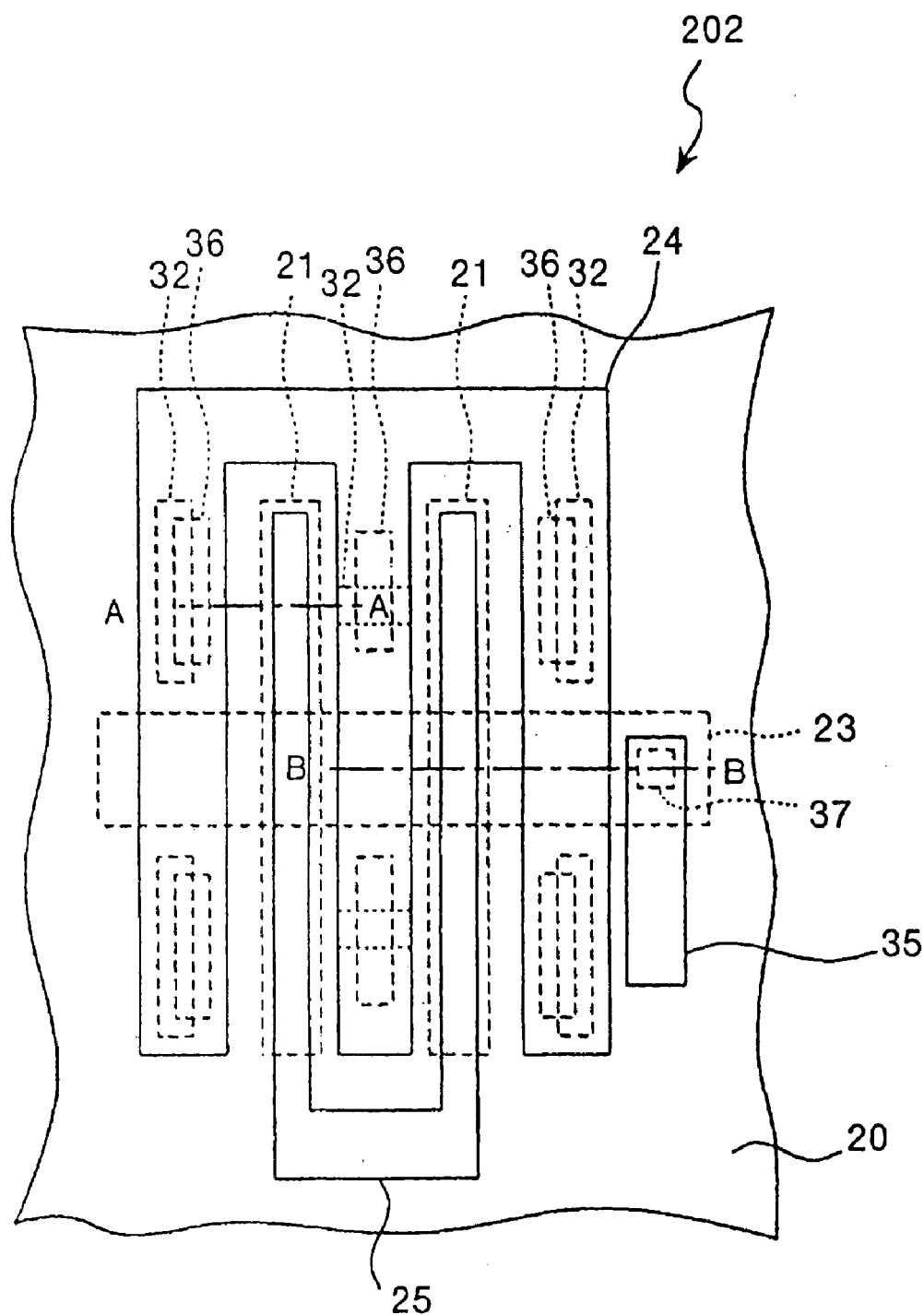
FIG. 31 is a plan view showing the construction of a conventional trench lateral power MOSFET.
Figure 32:
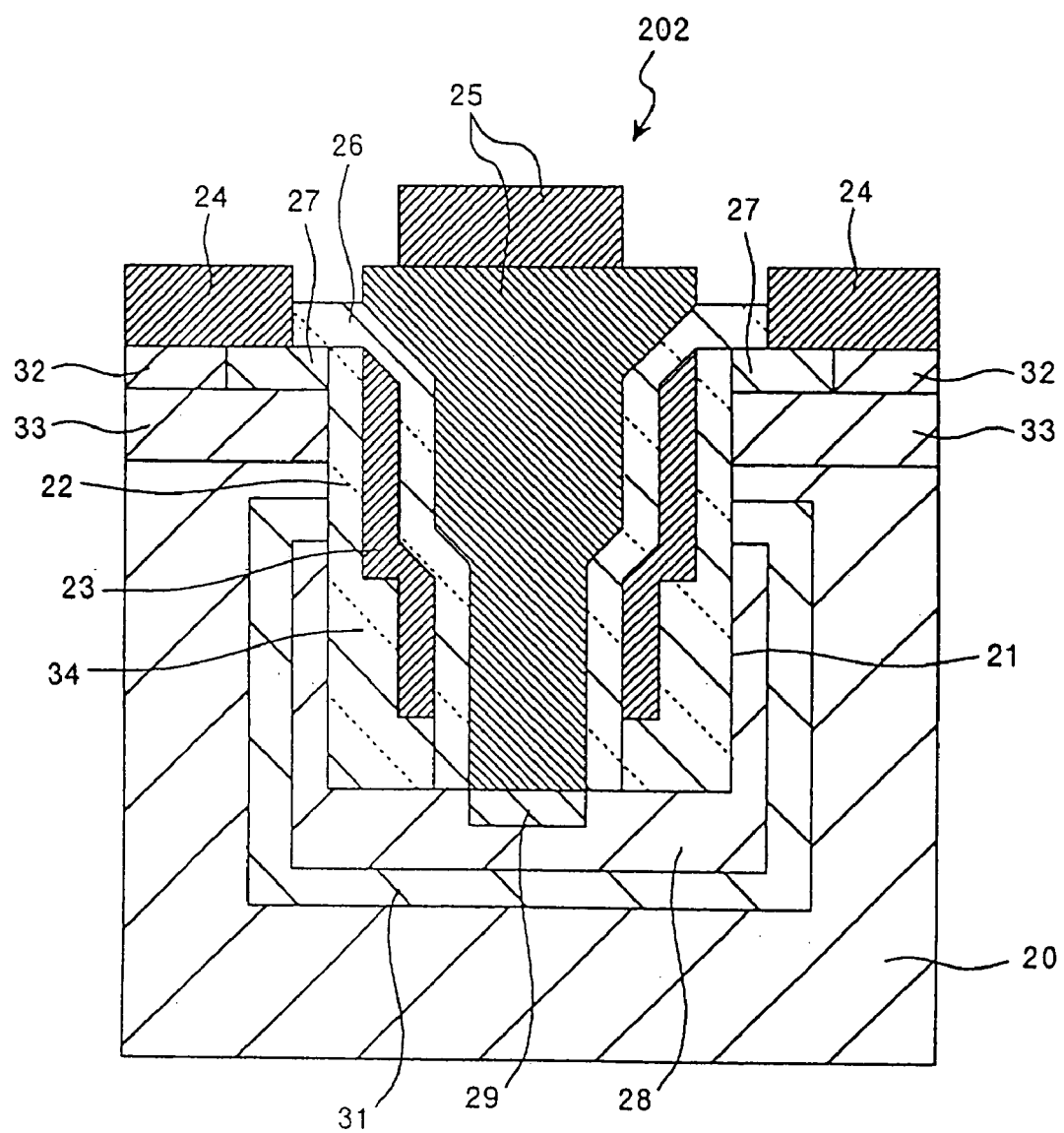
FIG. 32 is a sectional view showing the construction of the active region illustrated by line A—A in FIG. 31.
Figure 33:
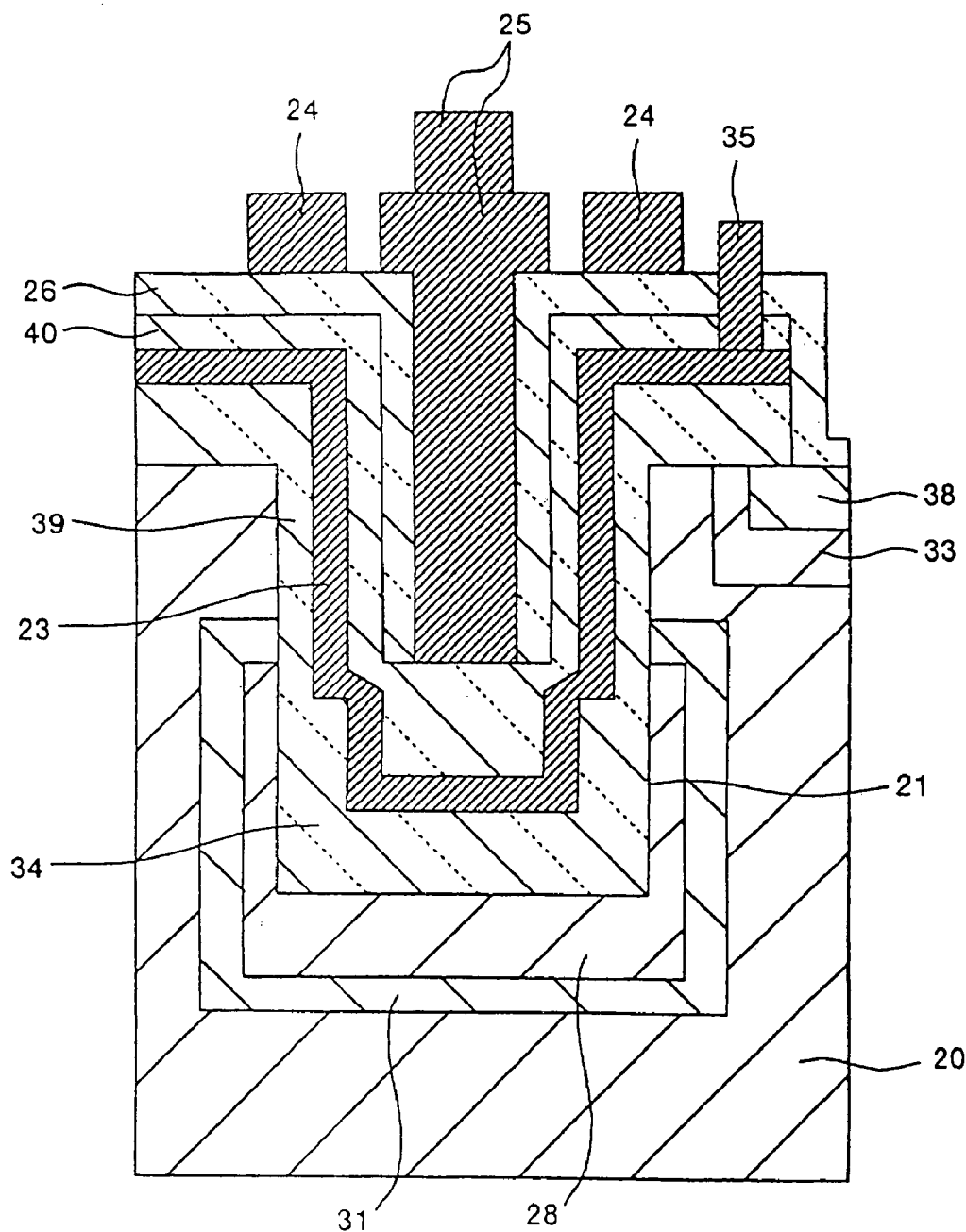
FIG. 33 is a sectional view showing the construction of the gate region illustrated by line B—B in FIG. 31.

According to the first embodiment as described above, the MOSFET is formed on the side portions of the trench 51 by self-alignment. Therefore, accurate mask alignment is necessary only in the selective oxidation process for forming the thick gate oxide film 83 on the bottom surface of the trench. Thus, the device pitch can be reduced. Also according to the first embodiment, there is no need to form a thick oxide film on the side portions of the trench in order to maintain a high breakdown voltage, unlike in the conventional 80V breakdown voltage trench lateral power MOSFET (see FIGS. 31 through 33), and hence the gate area and element size can be made smaller than this 80V breakdown voltage trench lateral power MOSFET. As a result, characteristic deterioration such as loss increases or increases in the wiring resistance and the like which can occur when a conventional trench lateral power MOSFET for use with an 80V breakdown voltage is applied to a 30V breakdown voltage can be avoided.

Furthermore, according to the first embodiment, parasitic capacitance occurring between the substrate and the element is reduced, and parasitic wiring resistance is reduced due to the fact that the wiring length of the gate, source and drain is shortened. Thus, the switching element speed can be increased and switching loss can be reduced. The effect of noise in adjacent elements can also be reduced. Also according to the first embodiment, trench etching need only be performed once in the manufacturing process, and hence manufacture by means of a simpler process than that of a conventional 80V breakdown voltage trench lateral power MOSFET, in which trench etching is performed twice, is possible. Hence, a deterioration in yield can be avoided.

Embodiment 2

Figure 20:
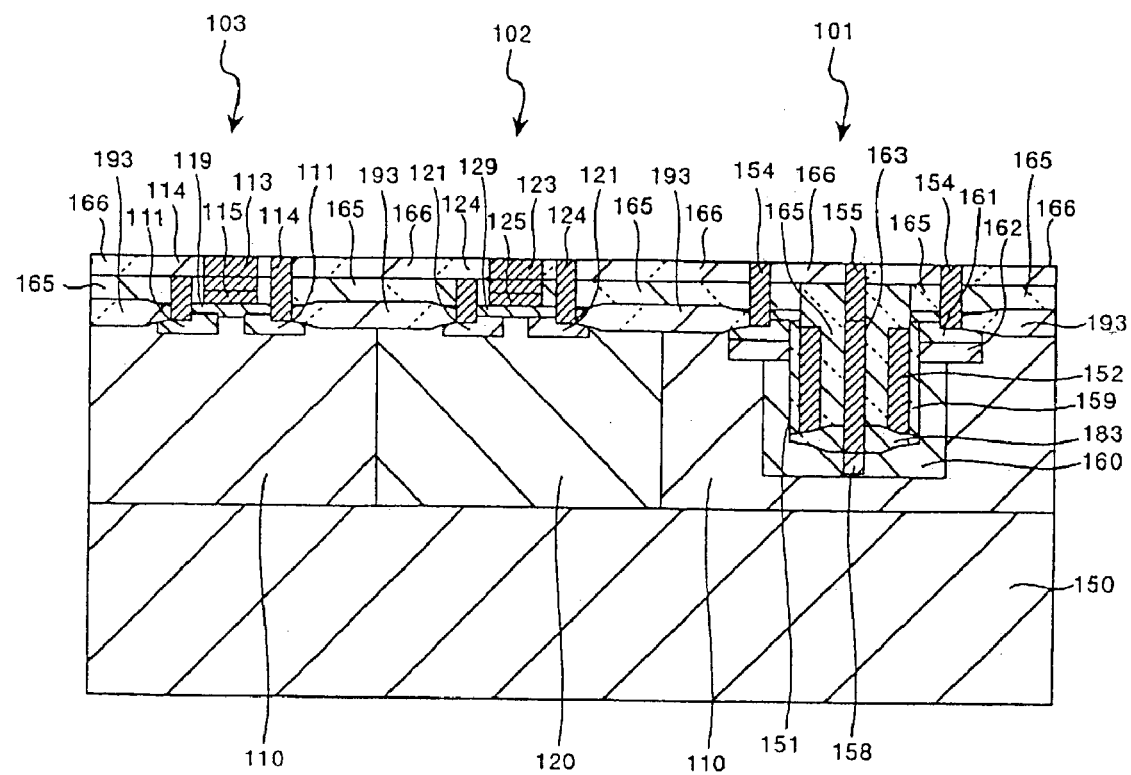
FIG. 20 is a sectional view showing the construction of the active region of a semiconductor device according to a second embodiment of the present invention.

Next, a semiconductor device will be explained in which the trench lateral power MOSFET according to the first embodiment is integrated onto the same substrate as both a P-type planar MOSFET (to be referred to hereafter as PMOS) and an N-type planar MOSFET (to be referred to hereafter as NMOS). FIG. 20 is a sectional view of the active region of this semiconductor device. As is illustrated in FIG. 20, this semiconductor device is constituted such that at least one each of a trench lateral power MOSFET 101, a PMOS 102, and an NMOS 103 is manufactured on the same p-type substrate 150. Note, however, that FIG. 20 shows one each of these MOSFETs. The trench lateral power MOSFET 101, PMOS 102 and NMOS 103 are separated from each other by an element-separating selectively oxidized film 193.

First, the construction of the trench lateral power MOSFET 101 will be described. A p-type well region 110 is formed on the p-type substrate 150, and the trench lateral power MOSFET 101 is formed inside this p-type well region 110. A gate oxide film 159, which serves as a gate insulating film, is formed at a uniform thickness along the lateral surfaces of a trench 151. This gate oxide film 159 is connected to a gate oxide film 183 on the bottom surface of the trench 151. The gate oxide film 183 on the bottom surface of the trench 151 is formed so as to be thicker than the gate oxide film 159 on the lateral surfaces of the trench 151. Gate polysilicon 152, which serves as a first conductor, is formed substantially from top to bottom of the trench 151 along the inner side of the gate oxide film 159 on the lateral surfaces of the trench 151.

The region outside of the lower half of the trench 151 is an n diffusion region 160 which serves as an n-type drift region. The aforementioned p-type well region 110 is on the outside of this n diffusion region 160. Note that the trench lateral power MOSFET 101 may be formed in the p-type part on the outside of an n-type well region 120 (to be described herein below) of the PMOS 102 rather than inside the p-type well region 110. An n$^+$ diffusion region 158, which serves as a drain region, is provided in the central portion of the bottom of the trench 151 within the n diffusion region 160. The n$^+$ diffusion region 158 (drain region) is connected to drain polysilicon 163 which serves as a second conductor and which is provided on the inner side of the gate polysilicon 152 via an interlayer oxide film 165, which serves as an interlayer insulating film. The drain polysilicon 163 is connected to a drain electrode 155. The interlayer oxide film 165 covers the substrate surface, and a further interlayer oxide film 166 is laminated onto the interlayer oxide film 165.

The region outside of the upper half of the trench 151 is a p base region 162, and an $n^+$ diffusion region 161 which serves as a source region is formed on this p base region 162 in the substrate surface region. The $n^+$ diffusion region 161 (source region) is electrically connected to a source electrode 154 formed on the substrate surface. The p base region 162 is electrically connected to the source electrode 154 in a different planar location where the $n^+$ diffusion region 161 is absent. The longitudinal sectional construction of the gate region of the trench lateral power MOSFET 101 is similar to the construction shown in FIG. 3 of the first embodiment, and therefore an explanation of the construction of the gate region shall be omitted. The active region and gate region of the aforementioned constructions are present in the same element in the trench lateral power MOSFET 101.

Next, the construction of the PMOS 102 will be explained. The PMOS 102 is formed inside the n-type well region 120 that is provided in the p-type substrate 150. A gate oxide film 129 which serves as a gate insulating film is formed over two p+ diffusion regions 121, 121 which serve as a source region or drain region (to be referred to hereafter as "source/drain region") and a channel region therebetween so as to overlap the two $p^+$ diffusion regions 121, 121. Polysilicon 125, which serves as a first conductor, is formed on the gate oxide film 129. The gate polysilicon 125 is electrically connected to a gate electrode 123.

A source/drain electrode 124, which serves as a source electrode or a drain electrode, is formed on each $p^+$ diffusion region 121 and is electrically connected to each $p^+$ diffusion region 121. The gate electrode 123 and the source/drain electrodes 124 are electrically insulated by the aforementioned interlayer oxide films 165, 166. In the example shown in FIG. 20, the n-type well region 120 contacts the p-type well region 110 at the lower side of a selectively oxidized film 193. Note, however, that when there is no p-type well region 110, the n-type well region 120 terminates at the lower side of the selectively oxidized film 193.

Next, the construction of the NMOS 103 will be described. The NMOS 103 is formed inside a p-type well region 110. A gate oxide film 119 which serves as a gate insulating film is formed over two $n^+$ diffusion regions 111, 111 which serve as a source/drain region and a channel region therebetween so as to overlap the $n^+$ diffusion regions 111, 111. Note that the NMOS 103 may be formed in the p-type part on the outside of the n-type well region 120 of the PMOS 102 rather than inside the p-type well region 110.

Gate polysilicon 115 which serves as a first conductor is formed on the gate oxide film 119. The gate polysilicon 115 is electrically connected to a gate electrode 113. A source/drain electrode 114, which serves as a source electrode or a drain electrode is electricallly connected to $n^+$ diffusion regions 111. The gate electrode 113 and the source/drain electrodes 114 are electrically insulated by the aforementioned interlayer oxide films 165, 166.

The dimensions of each part of the trench lateral power MOSFET 101 and the surface concentration of impurities in this case are as follows, although there are no particular limitations thereon. The trench 151 has a depth of 2 $\mu$m and a width of 3 $\mu$m, for example. The pitch of the trench 151 is 3 $\mu$m, for example. The p base region 162 and the $n^+$ diffusion region 161, which serves as a source region, are formed in the substrate surface regions on either side of this 3 $\mu$m-width trench 151. The diffusion depth of the p base region 162 is 1 $\mu$m, for example, and the surface concentration thereof is $1 \times 10^{18}$ cm$^{-3}$, for example. The $n^+$ diffusion region 158 (drain region) and the $n^+$ diffusion region 161 (source region) each have a diffusion depth of 0.2 $\mu$m and a surface concentration of $1 \times 10^{20}$ cm$^{-3}$, for example. The diffusion depth of the n diffusion region 160 (drift region) is 2 $\mu$m and the surface concentration thereof is $2 \times 10^{16}$ cm$^{-3}$, for example.

The p-type well region 110 has a diffusion depth of 6 $\mu$m and a surface concentration of $1 \times 10^{17}$ cm$^{-3}$, for example. The thickness of the gate oxide film 159 on the lateral surfaces of the trench 151 is 0.02 $\mu$m, for example. The thickness of the gate oxide film 183 on the bottom surface of the trench 151 increases progressively along the lower side of the gate polysilicon 152 toward the drain polysilicon 163. The thickness of the gate oxide film 183 at the point on the lower side of the gate polysilicon 152, which is closest to the drain polysilicon 163, is 0.22 $\mu$m, for example. The thickness of the gate polysilicon 152 is 0.3 $\mu$m, for example.

The dimensions of each part of the PMOS 102 and the surface concentration of impurities are as follows, although again there are no particular limitations thereon. The diffusion depth of the n-type well region 120 is 6 $\mu$m and the surface concentration thereof is $1 \times 10^{17}$ cm$^{-3}$, for example. The $p^+$ diffusion regions 121 have a diffusion depth of 0.3 $\mu$m and a surface concentration of $1 \times 10^{20}$ cm$^{-3}$, for example. The thickness of the gate oxide film 129 is 0.02 $\mu$m, for example. The thickness of the gate polysilicon 125 is 0.3 $\mu$m, for example.

The dimensions of each part of the NMOS 103 and the surface concentration of impurities are as follows, although again there are no particular limitations thereon. The diffusion depth and surface concentration of the p-type well region 110 are as noted above. The $n^+$ diffusion regions 111 have a diffusion depth of 0.3 $\mu$m and a surface concentration of $1 \times 10^{20}$ cm$^{-3}$, for example. The thickness of the gate oxide film 119 is 0.02 $\mu$m, for example. The thickness of the gate polysilicon 115 is 0.3 $\mu$m, for example. The film thickness of the element-separating selectively oxidized film 193 is 0.6 $\mu$m, for example.

Next, the manufacturing process of the semiconductor device according to the second embodiment will be described. FIGS. 21 through 30 are sectional views showing the main parts of the manufacturing stages of the semiconductor device according to the second embodiment. Note that in these drawings, one each of the trench lateral power MOSFET 101, the PMOS 102, and the NMOS 103 is illustrated.

First, a buffer oxide film with a thickness of 0.03 $\mu$m, for example, is formed on the surface of the p-type substrate 150 which has a resistivity of 12 $\Omega$cm, and a nitride film is deposited thereon at a thickness of 0.15 $\mu$m by CVD, for example. Photoresist is applied thereon and then exposed and developed to form a resist mask for forming the n-type well region 120. Using this resist mask, the part of the nitride film on the formation region of the n-type well region 120 is selectively removed. Following removal of the resist mask, phosphorus is guided onto the p-type substrate 150 by means of ion implantation, for example, with the residual nitride film serving as a mask.

Figure 21:
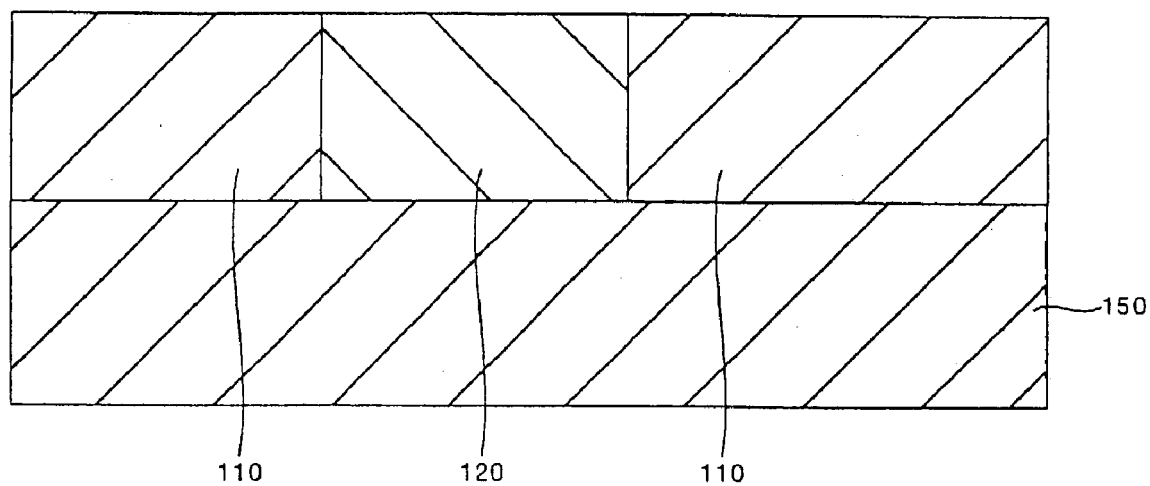
FIG. 21 is a sectional view showing the main parts of a stage of manufacture of the semiconductor device according to the second embodiment of the present invention.

Thereafter, heat is applied in a diffusion furnace at 900° C., for example, to cover the formation region of the n-type well region 120 with an oxide film at a thickness of 0.4 $\mu$m, whereupon the residual nitride film is removed. In so doing, a mask for forming the p-type well region 110 is formed on the substrate surface. Boron is guided onto the p-type substrate 150 by means of ion implantation, for example, with the oxide film serving as a mask. Next, heat treatment is performed in a diffusion furnace at 1100° C., for example. In so doing, the p-type well region 110 and n-type well region 120 are completed on the p-type substrate 150. Then, the oxide film, which served as the ion implantation mask, is removed (FIG. 21).

Figure 22:
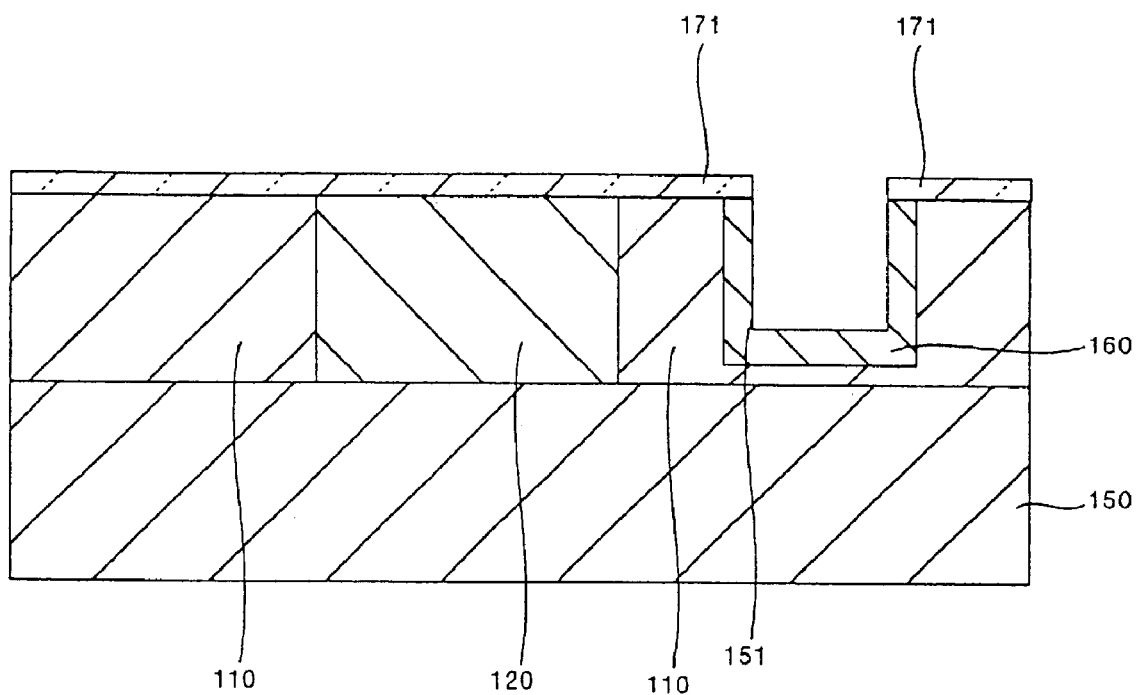
FIG. 22 is a sectional view showing the main parts of a stage of manufacture of the semiconductor device according to the second embodiment of the present invention.

Next, a mask oxide film 171 with a thickness of 0.4 µm, for example, is grown on the substrate surface by CVD or the like, and one part thereof is selectively removed to open a trench formation portion inside the p-type well region 110. With this patterned mask oxide film 171 serving as a mask, a plurality of trenches 151 with opening widths of 3 µm, for example, are formed by means of RIE at intervals of 3 µm, for example. Then, using oblique ion implantation, the n diffusion region 160, which serves as the drift region is formed on the bottom surface and lateral surface parts of the trench 151 in the substrate 150 (FIG. 22).

Following removal of the mask oxide film 171, a buffer oxide film 181 is formed at a thickness of 0.03 µm, for example, and a nitride film 182 with a thickness of 0.15 µm, for example, is deposited thereon. Photoresist is then applied, and by means of exposure and development, one part of the photoresist on the bottom surface of the trench 151 in the active region and the boundary parts thereof between the p-type well regions 110 and the n-type well region 120 are selectively removed to form a resist mask. Using this resist mask, one part of the nitride film 182 on the bottom surface of the trench 151 in the active region and the boundary parts thereof between the p-type well regions 110 and the n-type well region 120 are selectively removed. At this point, the nitride film on the bottom surface of the trench 151 in the gate region may also be removed.

Figure 23:
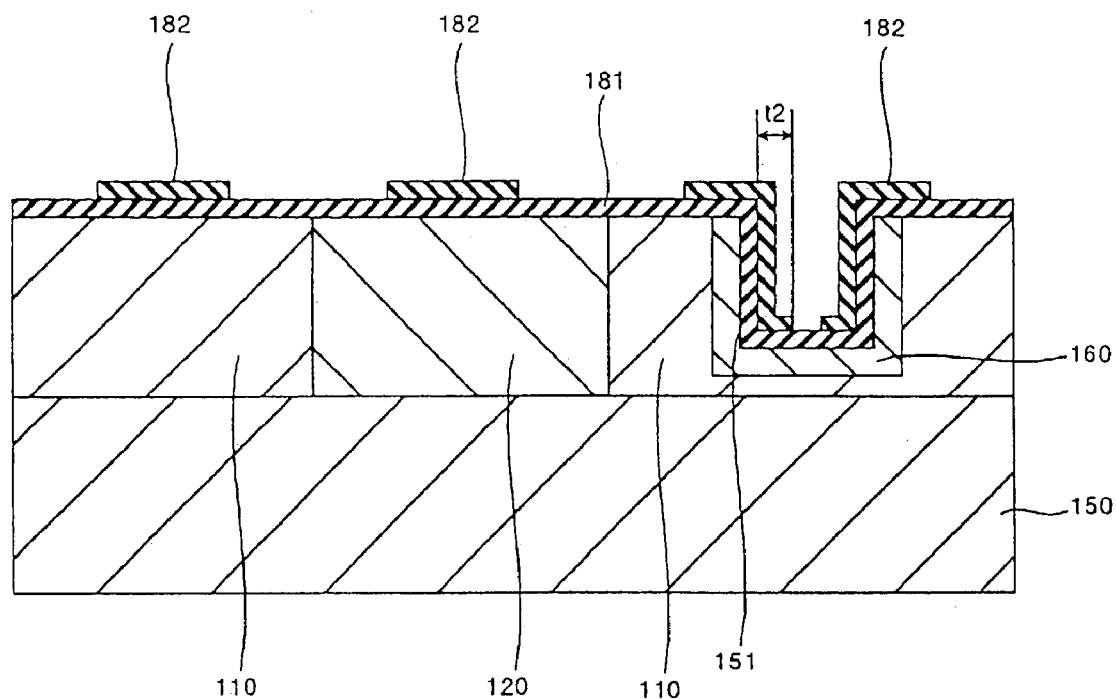
FIG. 23 is a sectional view showing the main parts of a stage of manufacture of the semiconductor device according to the second embodiment of the present invention.

Next, the residual resist mask is removed. Through this process, the buffer oxide film 181 is exposed in one part of the bottom surface of the trench 151 in the active region and in the boundary parts between the p-type well regions 110 and the n-type well region 120. In this case, the distance t2 on the bottom surface of the trench 151 in the active region between the exposed region of the buffer oxide film 181 in which the nitride film 182 has been removed and the edge of the bottom surface of the trench is at least 0.5 µm, for example. Further, in the regions including a boundary between a p-type well region 110 and the n-type well region 120, the buffer oxide film 181 is exposed at widths of 5 µm, for example, through removal of the nitride film 182 (FIG. 23).

Figure 24:
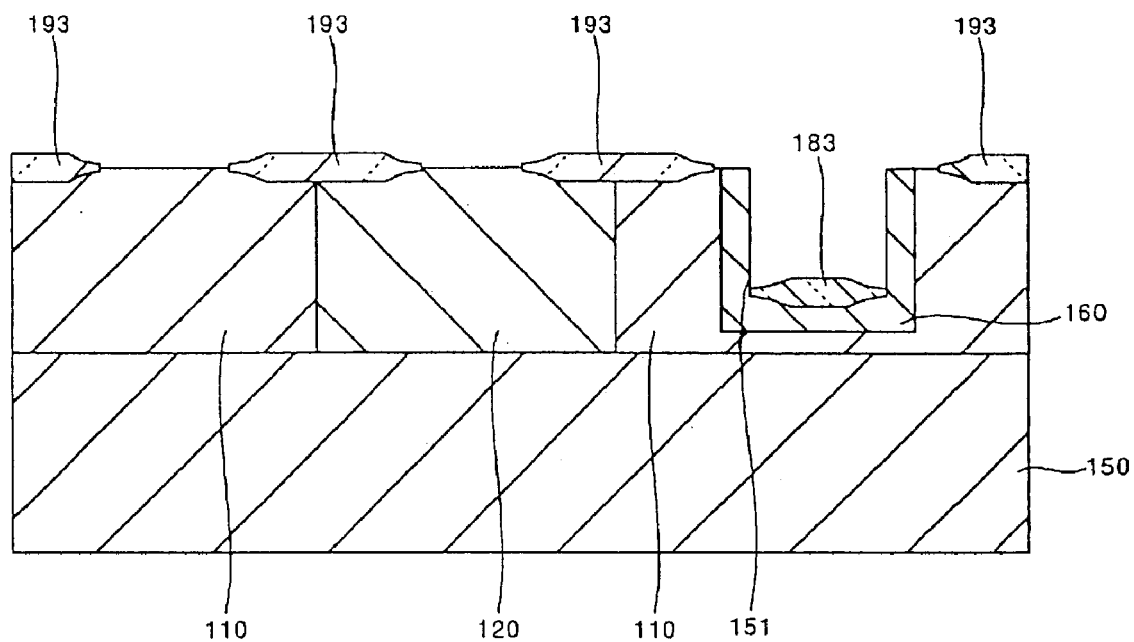
FIG. 24 is a sectional view showing the main parts of a stage of manufacture of the semiconductor device according to the second embodiment of the present invention.

Next, thermal oxidation is performed at 1000° C., for example, with the residual nitride film 182 serving as a mask, and the opening portions of the nitride film 182 are selectively oxidized. Thereby, the gate oxide film 183 is formed at a thickness of 0.6 µm, for example, on the bottom surface of the trench 151. Further, the element-separating selectively oxidized film 193 is formed on the boundary parts between the p-type well regions 110 and the n-type well region 120. The nitride film 182 and the buffer oxide film 181 are subsequently removed (FIG. 24).

Figure 25:
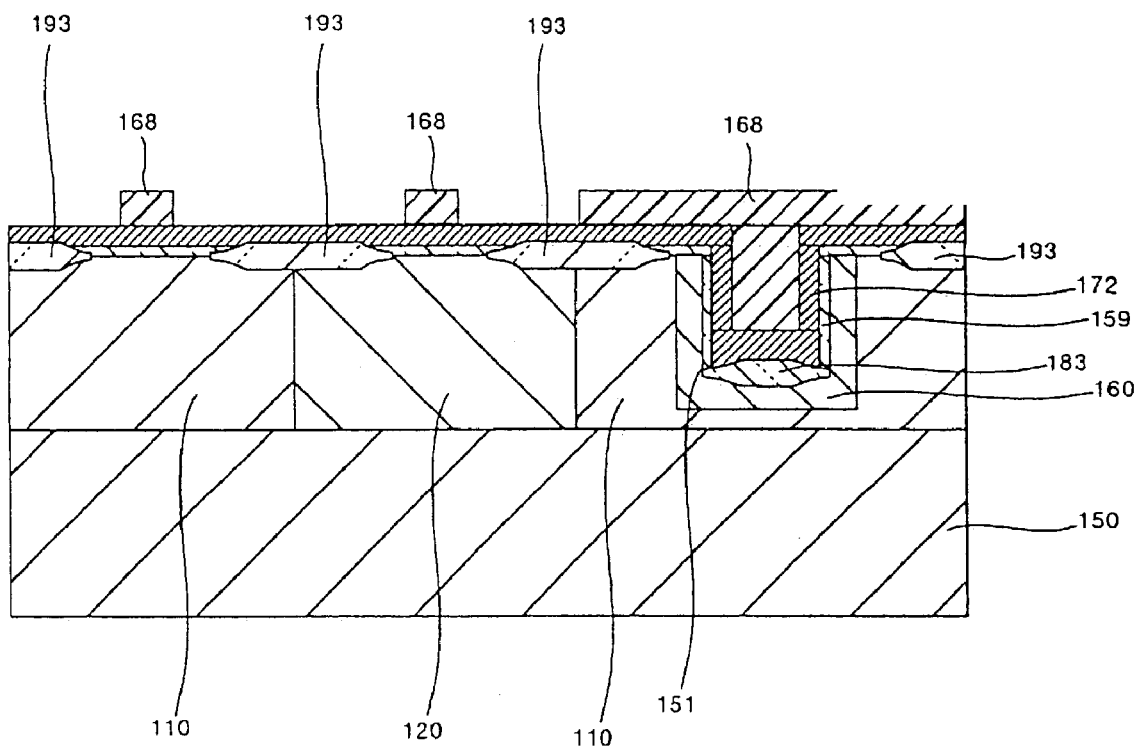
FIG. 25 is a sectional view showing the main parts of a stage of manufacture of the semiconductor device according to the second embodiment of the present invention.

Next, following purification of the lateral surfaces of the trench 151 and the substrate surface by sacrificial oxidation, the gate oxide film 159 is formed at a thickness of 0.02 µm, for example, on the substrate surface and the lateral surfaces and bottom surface of the trench 151. Then, the polysilicon 172 is deposited at a thickness of 0.3 µm, for example, on the gate oxide film 159 and the element-separating selectively oxidized film 193. Photoresist is applied thereon and then exposed and developed to selectively form a resist mask 168 only on the gate electrode formation parts of the PMOS 102 and the NMOS 103 and the formation region of the trench lateral power MOSFET 101 (FIG. 25).

Figure 26:
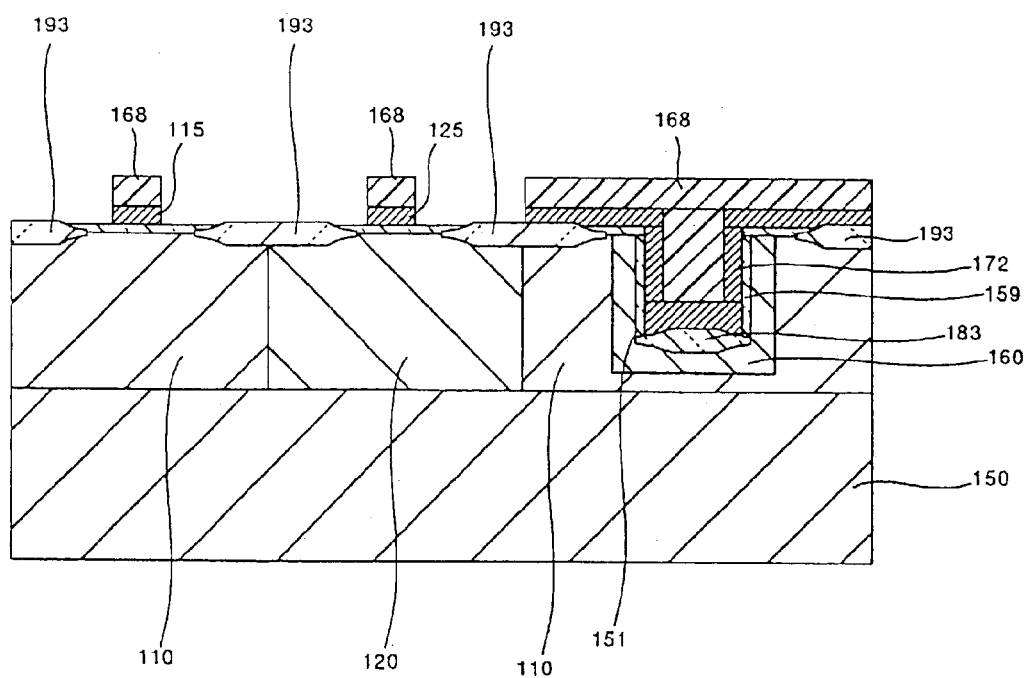
FIG. 26 is a sectional view showing the main parts of a stage of manufacture of the semiconductor device according to the second embodiment of the present invention.

Using this resist mask 168, the polysilicon 172 is etched back by means of anisotropic etching. Through this process, the polysilicon 172 is removed from the formation regions of the PMOS 102 and the NMOS 103 except in the parts which are to become gate electrodes, and thus the polysilicon 172 remains only in the gate electrodes. This remaining polysilicon 172 becomes the gate polysilicon 125 of the PMOS 102 and the gate polysilicon 115 of the NMOS 103 (FIG. 26).

Figure 27:
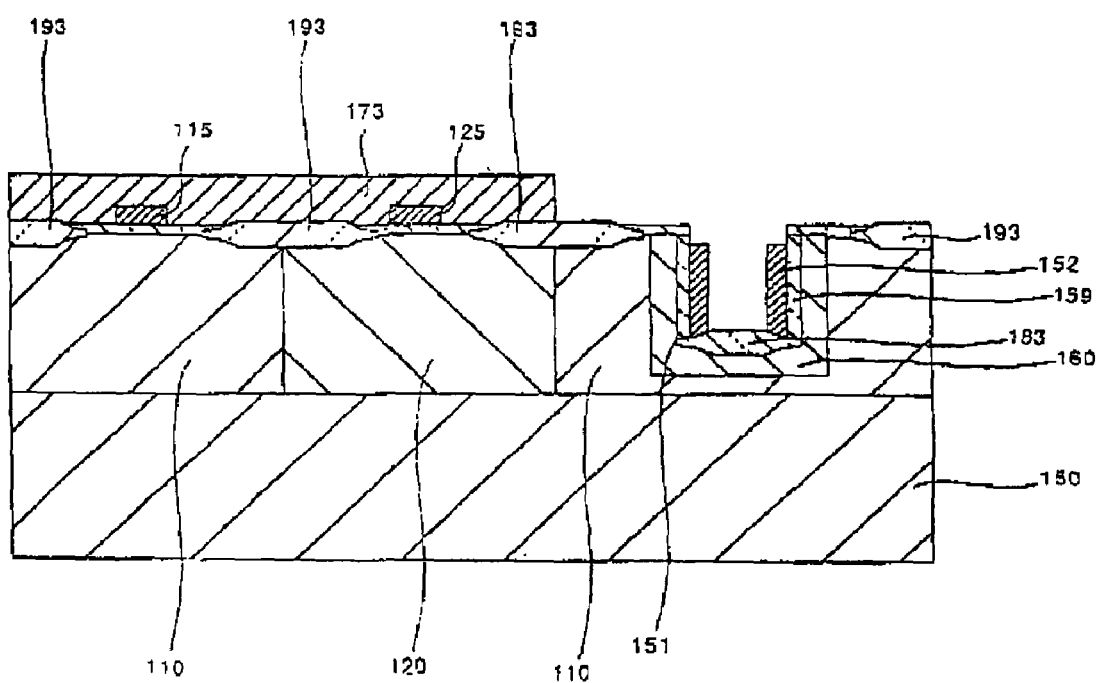
FIG. 27 is a sectional view showing the main parts of a stage of manufacture of the semiconductor device according to the second embodiment of the present invention.

Next, the resist mask 168 is removed so that the polysilicon 172 on the surface of the formation region of the trench lateral power MOSFET 101 is exposed. Photoresist is applied again and a resist mask 173 is selectively formed by exposure and development of the photoresist [on the substrate surface] excluding the active region of the trench lateral power MOSFET 101. Using this resist mask 173, the polysilicon 172 is etched back by anisotropic etching. Through this process, the polysilicon 172 is removed from the active region of the trench lateral power MOSFET 101 excluding the lateral surfaces of the trench 151 such that the polysilicon 172 remains only on the lateral surfaces of the trench 151. This remaining polysilicon 172 becomes the gate polysilicon 152 in the active region. In this etching-back process, the upper edge of the residual polysilicon 172 in the active region is over-etched so as to be lower than the surface of the trench 151, or in other words lower than the initial substrate surface. Thereby, the upper edge of the polysilicon 172 also becomes lower than the upper surface of the gate oxide film 159 on the substrate surface (FIG. 27).

Next, boron, for example, is ion-implanted onto the substrate surface in order to form the p base region 162. Following removal of the resist mask 173, photoresist is again applied, a resist mask is selectively formed only on the formation region of the PMOS 102 through exposure and development of the photoresist, and arsenic, for example, is ion-implanted. The resist mask is then removed and photoresist is again applied, and a resist mask, which is selectively opened only in the formation region of the PMOS 102, is formed through exposure and development of the photoresist. $BF_2$, for example, is then ion-implanted and the resist mask removed.

Figure 28:
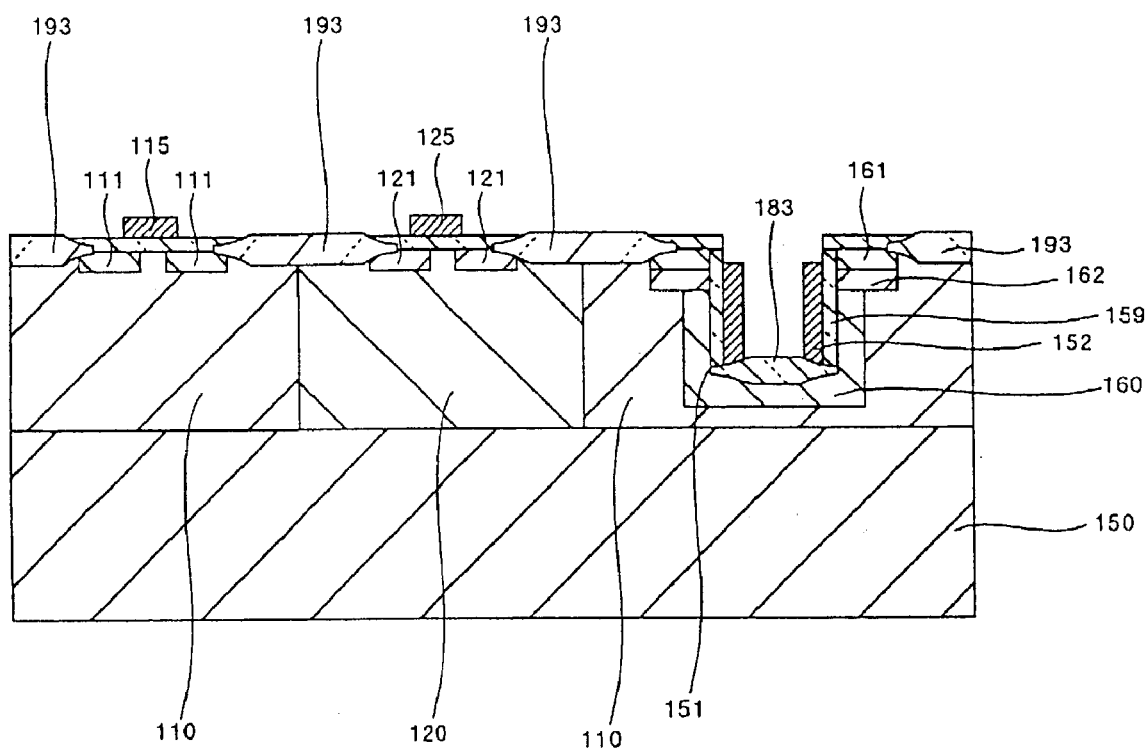
FIG. 28 is a sectional view showing the main parts of a stage of manufacture of the semiconductor device according to the second embodiment of the present invention.

Next, drive-in treatment is performed in a diffusion furnace at 800° C., for example. Thereby, the p base region 162 and the $n^+$ diffusion region 161 (source region) are formed in the active region of the trench lateral power MOSFET 101 at respective diffusion depths and surface concentrations of 1 µm and $1 \times 10^{18}$ cm$^{-3}$, and 0.2 µm and $1 \times 10^{20}$ cm$^{-3}$, for example. Further, the $p^+$ diffusion regions 121 are formed in the PMOS 102 at a diffusion depth of 0.2 µm and a surface concentration of $1 \times 10^{20}$ cm$^{-3}$, for example. In the NMOS 103, meanwhile, the $n^+$ diffusion regions 111 are formed at a diffusion depth of 0.2 µm and a surface concentration of $1 \times 10^{20}$ cm$^{-3}$, for example (FIG. 28).

Figure 29:
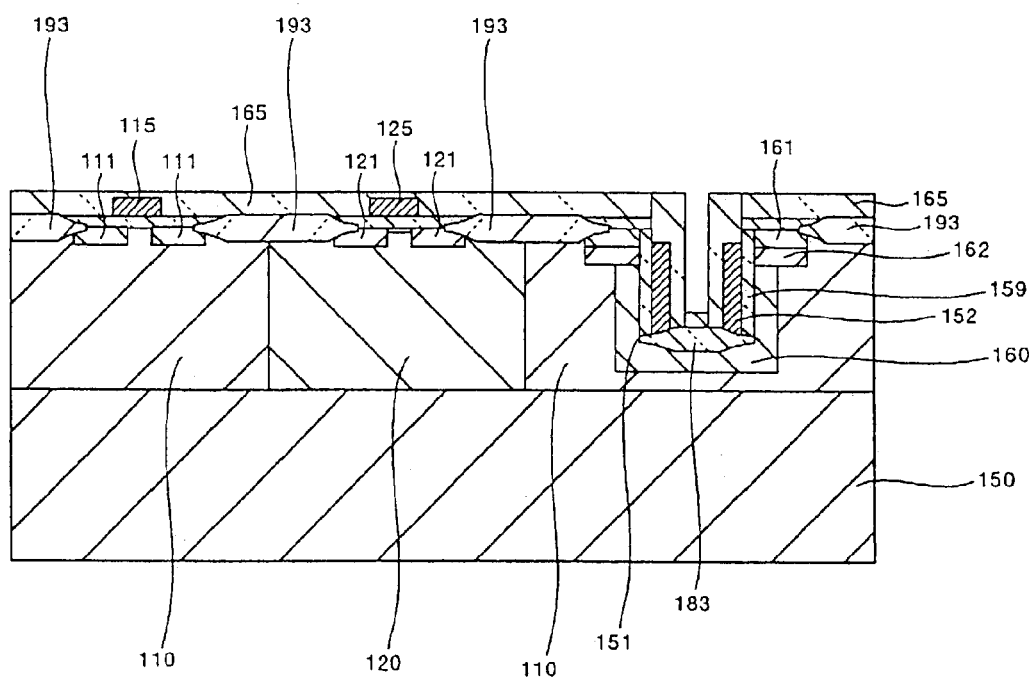
FIG. 29 is a sectional view showing the main parts of a stage of manufacture of the semiconductor device according to the second embodiment of the present invention.

Next, the interlayer insulating film 165 is laminated by a film formation method such as LPCVD or P-TEOS in an atmosphere of approximately 400° C. By using such a film formation method, the growth rate of the interlayer insulating film 165 inside the trench 151 is approximately 50% of the growth rate of the interlayer insulating film 165 outside of the trench 151, or in other words on the substrate surface. As a result, the thickness of the part of the interlayer oxide film 165, which is deposited on the bottom surface of the trench 151, is thinner than the part on the substrate surface (FIG. 29).

Figure 30:
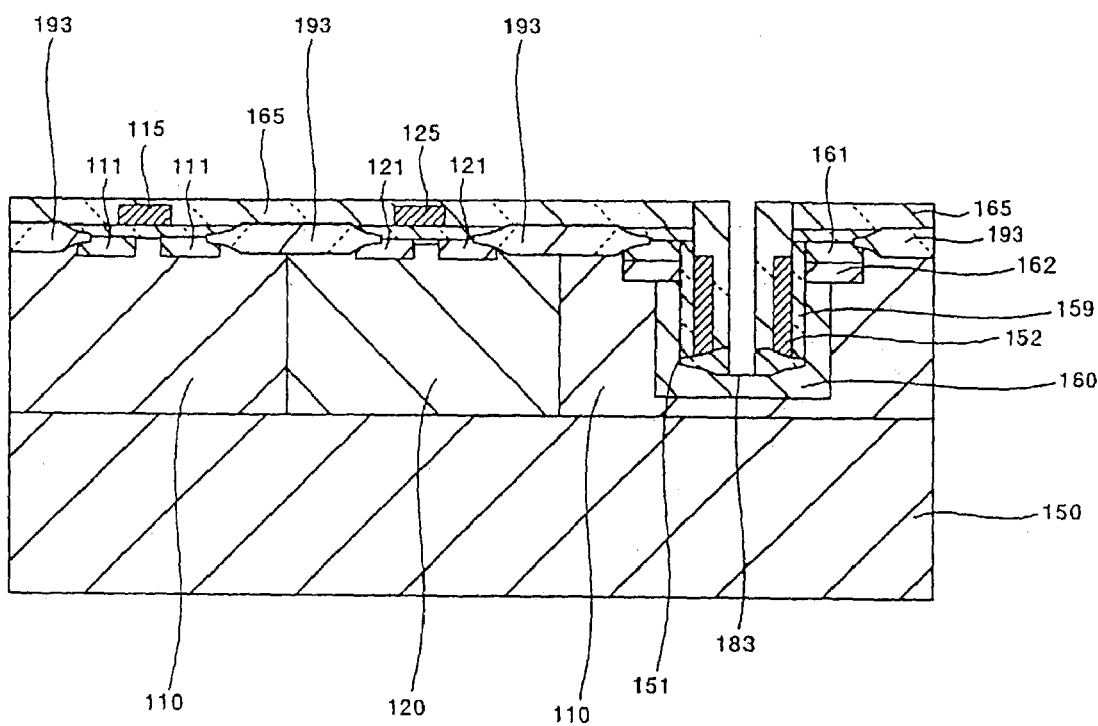
FIG. 30 is a sectional view showing the main parts of a stage of manufacture of the semiconductor device according to the second embodiment of the present invention.

Next, photoresist is applied and a resist mask is formed by removing one part of the photoresist on the bottom surface of the trench 151 in the active region by means of exposure and development. Using this resist mask, one part of the interlayer oxide film 165 and the trench bottom surface thick gate oxide film 183 on the bottom surface part of the trench 151 in the active region is selectively removed to form a contact hole passing through the interlayer oxide film 165 and the gate oxide film 183. The residual resist mask is then removed (FIG. 30).

Next, the n$^+$ diffusion region 158, which serves as the drain region, is formed on the bottom portion of the trench 151 in the active region by means of ion implantation. Note that instead of performing selective removal of the interlayer oxide film 165 by photolithography technology and etching, the contact hole may also be opened by removing the interlayer oxide film 165 and thick gate oxide film 183 through self-alignment due to the combination film thickness of the thick gate oxide film 183 on the trench bottom surface, the polysilicon 172 serving as the gate polysilicon 152, and the interlayer oxide film 165.

Next, polysilicon is deposited and etched back to be buried inside the trench 151 by the polysilicon 163, whereupon the interlayer insulating film 166 is formed over the whole surface thereof. Contact holes are opened in the interlayer insulating film 166 and metal is deposited to form the source electrode 154 and drain electrode 155 of the trench lateral power MOSFET 101, the gate electrode 123 and source/drain electrode 124 of the PMOS 102, and the gate electrode 113 and source/drain electrode 114 of the NMOS 103. In performing all of the above steps, a semiconductor device comprising the trench lateral power MOSFET 101, PMOS 102 and NMOS 103, which have sectional constructions in the active region as illustrated in FIG. 20, is completed.

Next, regarding the trench lateral power MOSFET 101, the results of a consideration of the preferable range of or mutual relationship between the aforementioned parameter t2, the film thickness tp of the gate polysilicon 152, and the thickness t1 of the gate oxide film 183 at the point on the lower side of the gate polysilicon 152 which is closest to the drain polysilicon 163 will be explained. Having investigated the value of t1 in the ranges of $0.2\,\mu m \leq tp \leq 0.7\,\mu m$ and $0.18\,\mu m \leq t2 \leq 1.4\,\mu m$, similar results to those of the first embodiment were obtained. That is, if $0.18\,\mu m \leq t2 \leq tp+0.6\,\mu m$, the thickness of the gate oxide film 183 at the point on the lower side of the gate polysilicon 152 which is closest to the drain polysilicon 163 is thicker than the part of the gate oxide film 159 covering the lateral surfaces of the trench 151.

Further, having investigated the breakdown voltage of the trench lateral power MOSFET 101, it was discovered that, similarly to the first embodiment, the breakdown voltage is highest when $0.18\,\mu m \leq t2 \leq tp+0.2\,\mu m$, next highest when $tp+0.2\,\mu m \leq t2 \leq tp+0.4\,\mu m$, and next highest when $tp+0.4\,\mu m \leq t2 \leq tp+0.6\,\mu m$. The reasons for this improvement in the breakdown voltage are the increase in the film thickness of the gate oxide film 183 in the vicinity of the drain polysilicon 163, and the fact that upon selective oxidation to create the gate oxide film 183, the trench corner portion on the bottom surface of the trench 151 becomes rounded. Further, the reason for the successive increase in the breakdown voltage as noted above is that the film thickness of the gate oxide film 183 in the vicinity of the drain polysilicon 163 grows thicker in similar succession.

Next, the results of an investigation into the relationship of the on-state resistance and breakdown voltage of the trench lateral power MOSFET 101 with the aforementioned parameter t1 will be explained. Note that the film thickness tp of the gate polysilicon 152 is set at $0.3\,\mu m$. As in the first embodiment, the on-state resistance is substantially constant at approximately 13 $\Omega\cdot mm^2$ regardless of the value of t1. The reason that the on-state resistance is substantially constant is that resistance in the channel region of the p base region 162 which faces the gate oxide film 159 on the side walls of the trench controls the on-state resistance. The breakdown voltage is 15V when the value of t1 is the same as the film thickness of the gate oxide film 159 on the sidewalls of the trench ($0.02\,\mu m$), and becomes higher as t1 increases, exceeding 30V when the value of t1 is $0.37\,\mu m$ or greater.

According to the second embodiment as described above, a semiconductor device comprising the trench lateral power MOSFET 101, PMOS 102, and NMOS 103 integrated on the same substrate can be manufactured, and thereby a semiconductor device in which the trench lateral power MOSFET 101, PMOS 102, and NMOS 103 are integrated on the same substrate can be obtained.

Also according to the second embodiment, the element-separating selectively oxidized film 193 and the thick gate oxide film 183 on the trench bottom surface of the trench lateral power MOSFET 101 can be manufactured by the same selective oxidation process, and hence the manufacturing process can be simplified.

Further, according to the second embodiment, miniaturization, lower energy consumption, higher reliability, and cost reduction can be achieved to a larger degree than in a conventional power IC in which a lateral power MOSFET and a control circuit are integrated.

The present invention as described above may be modified in various ways. For example, the dimensions, surface concentrations and the like of each part in the first and second embodiments may be set variously according to the required usage.

According to the present invention, a MOSFET is formed on the side portions of a trench by self-alignment. Therefore, accurate mask alignment is necessary only in the selective oxidation process of the bottom surface of the trench. Thus, the device pitch can be reduced. Also, since there is no need to form a thick oxide film in order to maintain a high breakdown voltage, unlike in a conventional 80V breakdown voltage trench lateral power MOSFET, the gate area and element size can be made smaller than this conventional 80V breakdown voltage trench lateral power MOSFET. As a result, characteristic deterioration which can occur when a conventional trench lateral power MOSFET for use with an 80V breakdown voltage is applied to a 30V breakdown voltage can be avoided. Also, trench etching need only be performed once in the manufacturing process, and hence manufacture by means of a simpler process than that of a conventional 80V breakdown voltage trench lateral power MOSFET, in which trench etching is performed twice, is possible. Thus, productivity can be improved and a deterioration in yield can be avoided.

According to another invention, a semiconductor device comprising a trench lateral power MOSFET, PMOS, and NMOS integrated on the same substrate can be manufactured, and thereby a semiconductor device in which a trench lateral power MOSFET, PMOS, and NMOS are integrated on the same substrate can be obtained. Also, the production process of an element-separating selectively oxidized film and the production process of a thick gate oxide film on the trench bottom surface of the trench lateral power MOSFET can be integrated, and hence the manufacturing process can be simplified. Further, a power IC can be obtained which is smaller, consumes less energy, is more reliable, and costs less than a conventional power IC in which a lateral power MOSFET and a control circuit are integrated.

What is claimed is:

1. A semiconductor device comprising:
   a trench provided in a semiconductor substrate of a first conductivity type;
   a source region of a second conductivity type which is formed in the substrate surface region, outside said trench;
   a base region of the first conductivity type formed below said source region, outside said trench;
   a drift region of the second conductivity type formed below said base region along the side portions of said trench, outside said trench;
   a drain region of the second conductivity type formed in the bottom portion of said trench;
   a gate insulating film formed inside said trench along the side portions and bottom portion of said trench;
   a first conductor formed on the inside of said gate insulating film; and
   a second conductor formed on the inside of said first conductor via an interlayer insulating film, and electrically connected to said drain region,
   wherein, in an active region of said device, the gate insulating film on the bottom surface of said trench extends from the side wall of said trench to said second conductor and contacts said second conductor, and
   wherein the gate insulating on the bottom surface of said trench becomes thicker, as measured in the direction of the depth of the trench, from the side wall of said trench or said first conductor toward said second conductor.

2. The semiconductor device according to claim 1, wherein said drift region extends along the side portions of said trench.

3. The semiconductor device according to claim 1, wherein said gate insulating film on the bottom surface of said trench becomes progressively thicker toward said second conductor.

4. The semiconductor device according to claims 1, wherein the part of said gate insulating film positioned below said first conductor is a selectively oxidized film formed by selective oxidation thereof.

5. A semiconductor device according to claim 1, further including a planar MOSFET on said substrate.

6. The semiconductor device according to claim 1, further including a gate electrode electrically connected to said first conductor, a source electrode electrically connected to said source region, and a drain electrode electrically connected to said second conductor.

* * * * *